(12) United States Patent
Wada

(10) Patent No.: US 10,764,988 B2
(45) Date of Patent: Sep. 1, 2020

(54) IMAGING DEVICE

(71) Applicant: PANASONIC INTELLECTUAL PROPERTY MANAGEMENT CO., LTD., Osaka (JP)

(72) Inventor: Shinichi Wada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/424,015

(22) Filed: May 28, 2019

(65) Prior Publication Data

US 2019/0373712 A1    Dec. 5, 2019

(30) Foreign Application Priority Data

May 31, 2018 (JP) .................................. 2018-104858
Dec. 6, 2018 (JP) .................................. 2018-229112

(51) Int. Cl.
*H05K 1/02* (2006.01)
*G03B 15/02* (2006.01)

(52) U.S. Cl.
CPC ........... *H05K 1/0204* (2013.01); *G03B 15/02* (2013.01); *H05K 2201/10106* (2013.01); *H05K 2201/10151* (2013.01)

(58) Field of Classification Search
CPC ....... H05K 1/0204; H05K 2201/10106; G03B 15/02
See application file for complete search history.

(56) References Cited

U.S. PATENT DOCUMENTS

| 7,040,388 B1 * | 5/2006 | Sato .......................... F28F 3/04 165/121 |
| 8,864,326 B2 * | 10/2014 | Armer ...................... F21V 9/083 362/6 |
| 9,622,302 B2 | 4/2017 | Mishima et al. |
| 2003/0038344 A1 * | 2/2003 | Palmer .............. H01L 21/76898 257/621 |
| 2006/0044762 A1 | 3/2006 | Kikuchi et al. |

(Continued)

FOREIGN PATENT DOCUMENTS

| JP | S63-292119 A | 11/1988 |
| JP | H04-137597 A | 5/1992 |

(Continued)

OTHER PUBLICATIONS

U.S. Appl. No. 16/477,206 to Shinichi Wada, filed Jul. 11, 2019.

(Continued)

*Primary Examiner* — Mukundbhai G Patel
(74) *Attorney, Agent, or Firm* — Greenblum & Bernstein, P.L.C.

(57) ABSTRACT

An imaging device includes LED elements disposed on a first surface of a board to be electrically connected to first and second wiring patterns, and emitting illumination light in an imaging direction of a camera. A first heat dissipation member and second heat dissipation members are mounted onto opposite sides of the board. The first heat dissipation member is disposed opposite to the first surface. Each of the second heat dissipation members is disposed opposite to a second surface in a region including an area opposite to the LED elements via the board.

20 Claims, 19 Drawing Sheets

(56) References Cited

U.S. PATENT DOCUMENTS

| | | | |
|---|---|---|---|
| 2010/0296805 A1* | 11/2010 | Mayer | G08B 13/19619 |
| | | | 396/155 |
| 2015/0186737 A1 | 7/2015 | Omi et al. | |
| 2017/0036647 A1 | 2/2017 | Zhao et al. | |
| 2018/0224111 A1* | 8/2018 | Emerson | F21V 29/67 |

FOREIGN PATENT DOCUMENTS

| | | |
|---|---|---|
| JP | 2005-150132 A | 6/2005 |
| JP | 2006-033296 A | 2/2006 |
| JP | 2006-074853 A | 3/2006 |
| JP | 2007-121593 A | 5/2007 |
| JP | 2008-211378 A | 9/2008 |
| JP | 2011-246056 A | 12/2011 |
| JP | 2014-027408 A | 2/2014 |
| JP | 2014-213826 A | 11/2014 |
| JP | 2017-520443 A | 7/2017 |
| WO | WO2011/142111 A1 | 11/2011 |

OTHER PUBLICATIONS

Office Action issued in Japanese family member Patent Appl. No. 2018-229112, dated Nov. 12, 2019, along with an English translation thereof.

* cited by examiner

IMAGING DEVICE

CROSS REFERENCE TO RELATED APPLICATIONS

The present application is based on and claims priority of Japanese Patent Application No. 2018-104858 filed on May 31, 2018 and Japanese Patent Application No. 2018-229112 filed on Dec. 6, 2018.

BACKGROUND

1. Technical Field

The present disclosure relates to imaging devices, and more particularly, to an imaging device that monitors a state of a passenger sitting in a seat of a vehicle.

2. Description of the Related Art

A conventionally known imaging device of this kind is disclosed in Japanese Unexamined Patent Application Publication No. 2014-27408 (Patent Literature (PTL) 1), for example.

SUMMARY

However, the imaging device according to PTL 1 can be improved upon. In view of this, the present disclosure provides an imaging device capable of improving upon the above related art.

To achieve this, an imaging device according to an aspect of the present disclosure includes: a camera; a board having a first surface, a second surface, and a wiring pattern disposed on at least one of the first surface and the second surface; a light-emitting element disposed on the first surface of the board to be electrically connected to the wiring pattern, and emitting illumination light in an imaging direction of the camera; and a first heat dissipation member and a second heat dissipation member that are mounted onto opposite sides of the board, and capable of dissipating heat generated at least by the board, wherein the first heat dissipation member is disposed opposite to the first surface, and the second heat dissipation member is disposed opposite to the second surface in a region including an area opposite to the light-emitting element via the board.

According to the present disclosure, heat generated by a board due to a light-emitting element is dissipated efficiently. This yields a highly reliable operating environment even if the board reaches a high temperature.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Underlying Knowledge Forming Basis of the Present Disclosure

The inventors have noticed that the imaging device mentioned in "Description of the Related Art" causes the following issue.

PTL 1 discloses the imaging device that includes: a board having a front side on which wiring is disposed; a camera implemented in a horizontal central position of the front side of the board and electrically connected to the board; and a pair of right and left LED elements implemented on the front side of the board on opposite sides of the camera, each at a predetermined spacing from the camera in the horizontal direction, and electrically connected to the board. The pair of right and left LED elements emits illumination light to a photographing area of the camera.

Such emission of illumination light causes the LED elements of the imaging device according to PTL 1 to generate heat due to power consumption and this heat is transferred to the front side of the board on which the LED elements are implemented. However, having no member to dissipate this heat, the imaging device according to PTL 1 is incapable of appropriately dissipating the heat generated by the board due to the LED elements.

In view of this, the present disclosure provides an imaging device that efficiently dissipates heat generated by a board due to a light-emitting element and that yields a highly reliable operating environment even if the board reaches a high temperature.

Hereinafter, embodiments according to the present disclosure are described in detail with reference to the drawings. Each of the embodiments described below is merely an example in nature and is not intended to limit the present disclosure or its application or uses.

Embodiment

Figure 1:
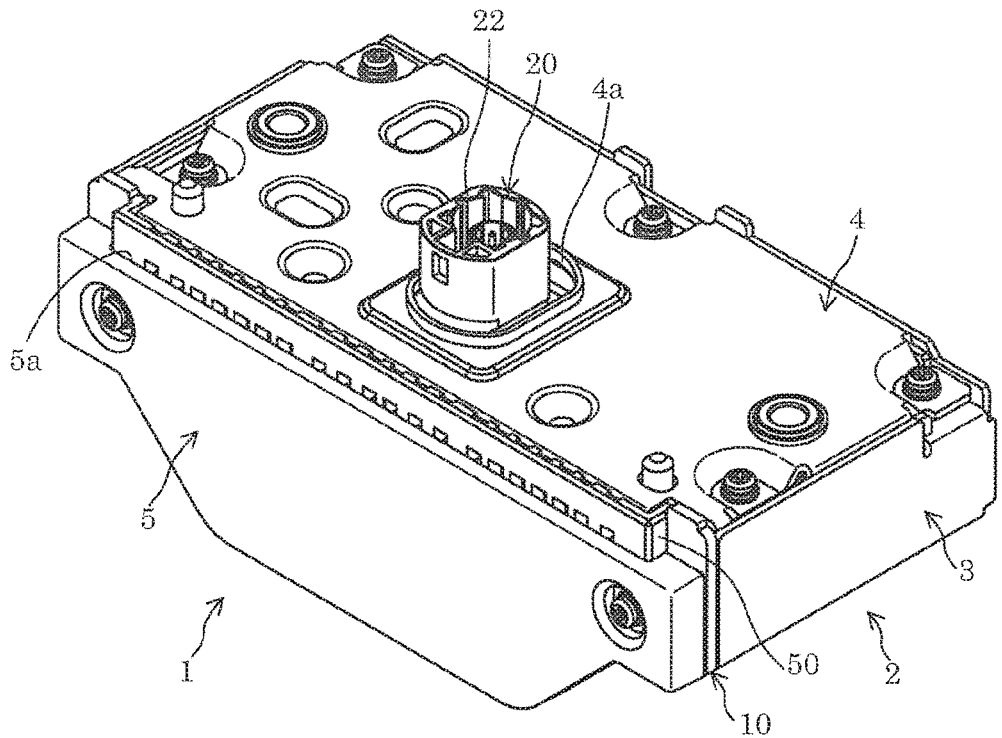
FIG. 1 is an overall perspective view of an imaging device seen from above according to Embodiment of the present disclosure.
Figure 2:
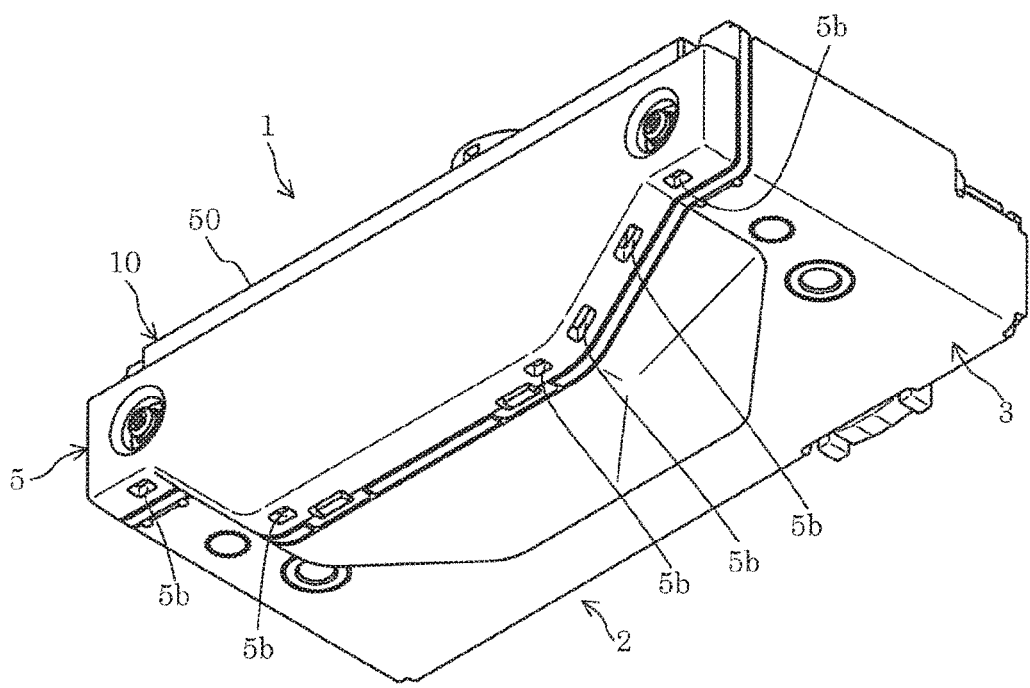
FIG. 2 is an overall perspective view of the imaging device seen from below according to Embodiment of the present disclosure.

FIG. 1 and FIG. 2 are overall views of imaging device 1 according to Embodiment. Imaging device 1 is installed in a vehicle and monitors a state of a passenger sitting in a seat of the vehicle. For example, imaging device 1 is installed inside overhead console 100 in the vehicle (see FIG. 11 to FIG. 13).

In an anteroposterior relationship between imaging device 1 and imaging unit 10 described below, first surface 30a of board 30 included in imaging unit 10 described later is a front side (located forward) and second surface 30b of board 30 is a back side (located backward). However, this positional relationship is unrelated to an actual anteroposterior direction of imaging device 1 or imaging unit 10 to be installed into the vehicle. As shown in FIG. 1 and FIG. 2, the downward direction in each of the drawings is defined as the direction of gravity. Thus, in the following, the downward direction refers to the direction of gravity and the upward direction refers to the direction opposite to the direction of gravity.

Cover Member

Figure 3:
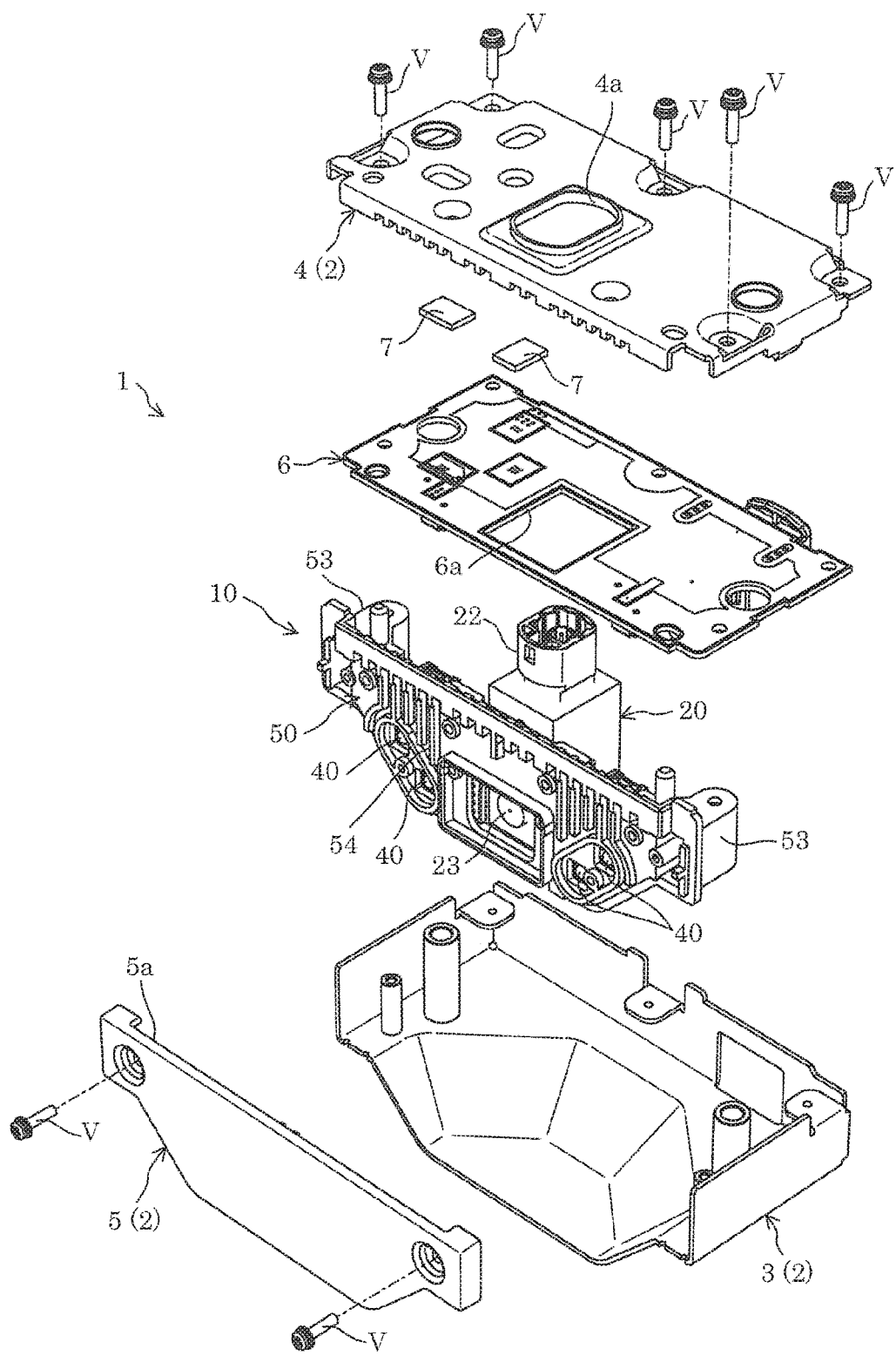
FIG. 3 is an exploded perspective view of the imaging device according to Embodiment of the present disclosure.

As shown in FIG. 1 to FIG. 3, imaging device 1 includes cover member 2. Cover member 2 is a casing of imaging device 1 and includes cover body 3, top cover 4, and front cover 5.

Each of cover body 3 and top cover 4 is made of a metallic material, such as aluminum, and configured to house main board 6 and imaging unit 10 described later. Top cover 4 is fastened to main board 6, which is described later, with screws V (see FIG. 3). Opening 4a is disposed in a central region of top cover 4 to expose power source 22 of camera 20 described later.

Front cover 5 is disposed opposite to heat dissipation surface 50b of first heat dissipation member 50 described later, and is fastened to first heat dissipation member 50 with screws V (see FIG. 3). Front cover 5 is made of a resin material, such as acrylic resin capable of transmitting a light wavelength in an ultraviolet range. Front cover 5 protects lens 23 and LED elements 40, which are described later, and allows illumination light from LED elements 40 to be transmitted ahead of imaging device 1.

As shown in FIG. 1 and FIG. 3, an upper end of front cover 5 is below an upper end of first heat dissipation member 50 described later. Cutout opening 5a is disposed in the upper end of front cover 5 and has a square U-shape. To make this shape, the upper end of front cover 5 is partially cut out forward from behind.

Cutout opening 5a is disposed above an upper end of each of fins 54, described later, with front cover 5 fastened to first heat dissipation member 50 (see FIG. 13 and FIG. 14). Cutout opening 5a provides a space between the upper end of front cover 5 and heat dissipation surface 50b of heat dissipation 50 described later.

As shown in FIG. 2, lower openings 5b are disposed in a lower end of front cover 5. Each of lower openings 5b vertically penetrates a lower surface of front cover 5. Lower openings 5b are spaced from each other in a circumferential direction of the lower surface of front cover 5. Each of lower openings 5b is disposed below and opposite to a lower end of each of fins 54 in a direction of gravity, with front cover 5 fastened to first heat dissipation member 50 described later (see FIG. 14).

Main Board

As shown in FIG. 3, imaging device 1 includes main board 6. For example, main board 6 has a multilayer structure containing polychlorinated biphenyl (PCB) and has a substantially rectangular shape in plan view. Main board 6 is electrically connected to board 30 of imaging unit 10 described later via a wiring member (not shown). Heat dissipation sheets 7 are disposed between top cover 4 and main board 6.

Main board 6 has camera insertion hole 6a that holds camera 20 described later by receiving an upper portion of camera 20 (or camera body 21). Camera insertion hole 6a vertically penetrates a central region of main board 6.

Imaging Unit

As shown in FIG. 1 to FIG. 4, imaging device 1 includes imaging unit 10. Main components of imaging unit 10 include camera 20, board 30, LED elements (light-emitting elements) 40, first heat dissipation member 50, second heat dissipation members 60, and heat dissipation sheets 70. Each of these components is described in detail as follows.

Camera

Camera 20 includes camera body 21. Camera body 21 is a casing having a substantially square pillar shape. Power source 22 for interfacing to an external device is disposed on an upper side of camera body 21. Lens 23 is disposed on a front side of camera body 21. Lens 23 is an example of an imaging opening at least for imaging with camera 20. Screw mounts 24 are disposed on right and left sides of camera body 21 to fasten camera 20 to board 30 and first heat dissipation member 50.

Board

Figure 4:
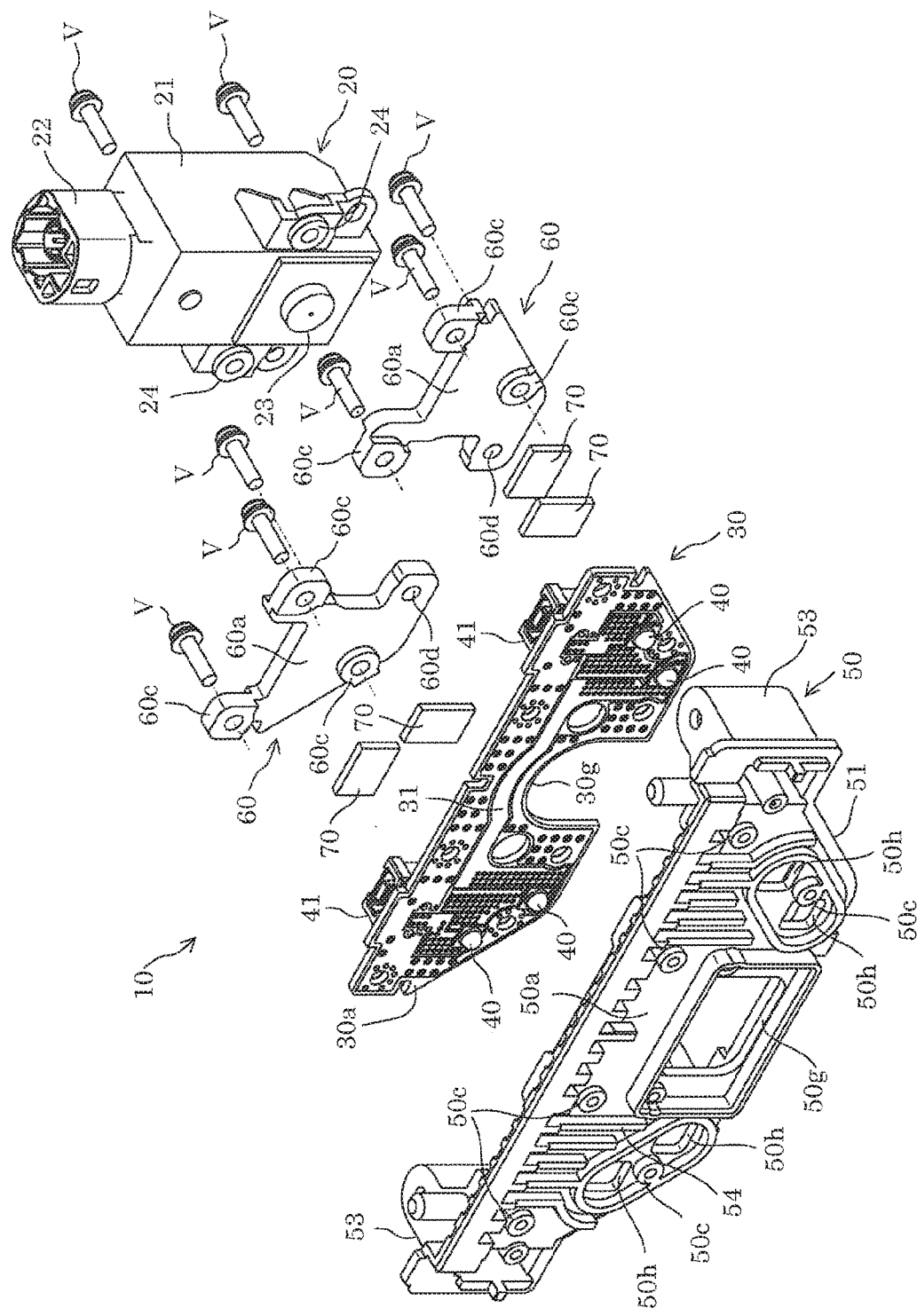
FIG. 4 is an exploded perspective view of an imaging unit according to Embodiment of the present disclosure.

As shown in FIG. 4, board 30 is substantially flat. For example, board 30 has a multilayer structure containing polychlorinated biphenyl (PCB). Each of lower corners on right and left ends of board 30 as seen from the front is chamfered. Board 30 is disposed in front of camera 20.

Figure 5:
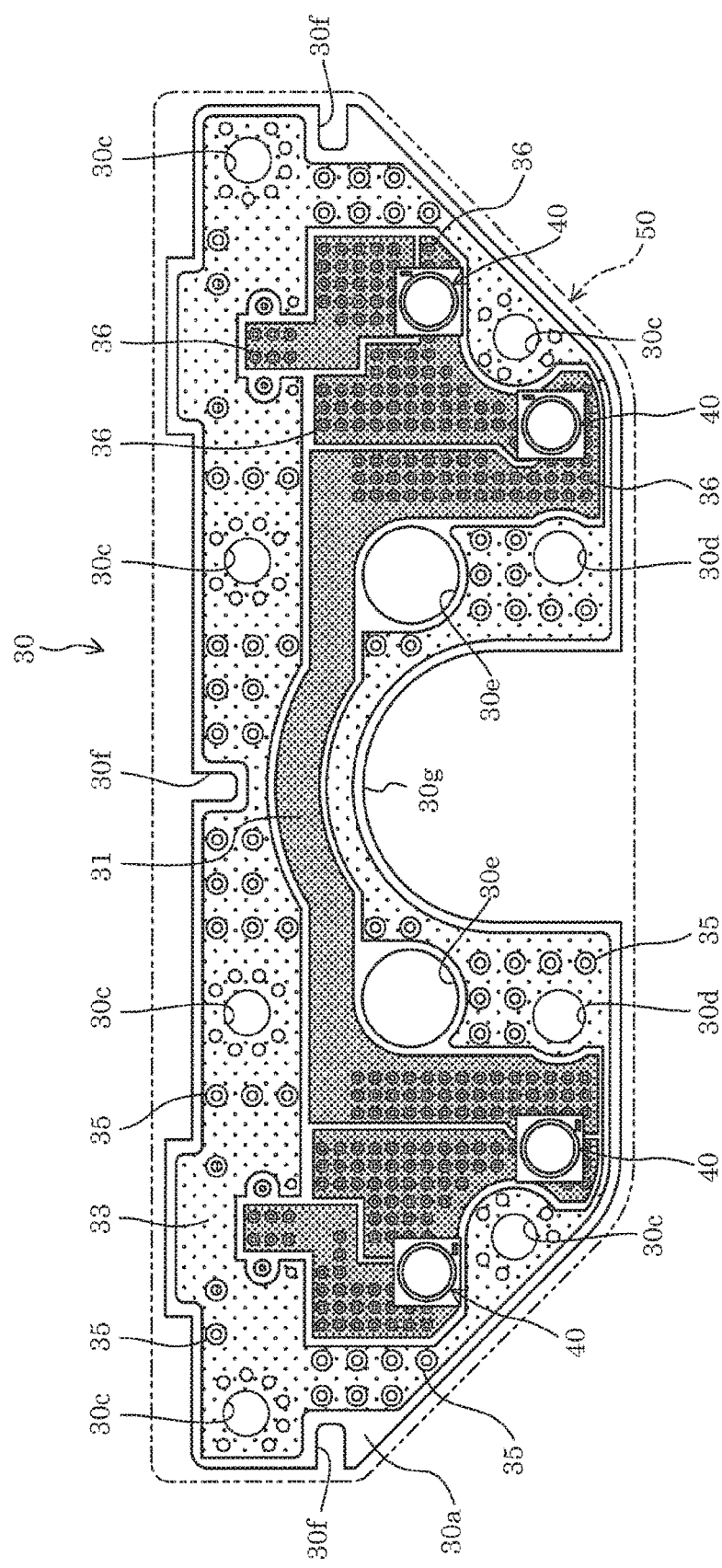
FIG. 5 is a front view of a board and LED elements.
Figure 6:
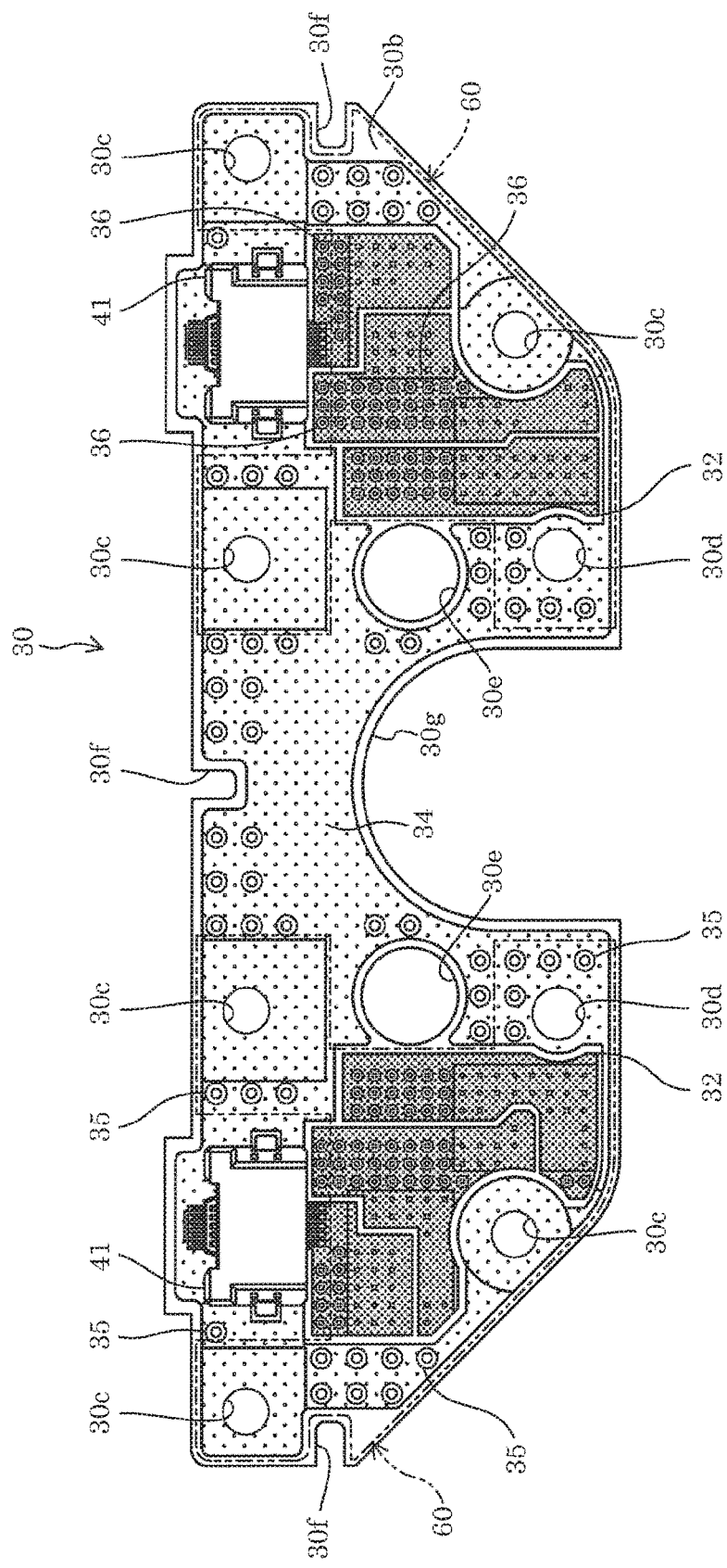
FIG. 6 is a rear view of the board.

As shown in FIG. 5 and FIG. 6, board 30 has first surface 30a and second surface 30b. First surface 30a is the front side of board 30, and second surface 30b is the back side of board 30. More specifically, board 30 is disposed so that first surface 30a is at the front side of imaging device 1.

Screw insertion holes 30c are disposed in predetermined positions of board 30. Moreover, board 30 has pin insertion holes 30d and boss insertion holes 30e to receive pins 50d and bosses 50e of first heat dissipation member 50 described later. Furthermore, board 30 has recesses 30f to be engageable with projections 50f of first heat dissipation member 50 described later. Recesses 30f have hollow shapes and are disposed in respective positions on the right and left side ends and upper end of board 30.

Board 30 has central opening 30g to expose lens 23 toward the front side of imaging unit 10. Central opening 30g is disposed in a substantially horizontal central position of board 30 in front view, and has a substantially arc shape.

To make this shape, board 30 is partially cut out from the lower end of board 30 toward a substantially vertical central position of board 30.

Board 30 includes connectors 41. Each of connectors 41 electrically connects main board 6 to wiring patterns described later via an external wiring member (not shown). More specifically, each of connectors 41 is connected to the external wiring member to electrically connect the external wiring member to the wiring patterns. Each of connectors 41 is fixed to an upper portion of second surface 30b of board 30.

Moreover, board 30 includes predetermined wiring patterns. To be more specific, the predetermined wiring patterns include first wiring pattern 31 and second wiring patterns 32, as shown in FIG. 5 and FIG. 6. Each of first wiring pattern 31 and second wiring patterns 32 is made of a conductive metal, such as copper foil.

In FIG. 5, first wiring pattern 31 and first ground part 33 described later are shaded with dots for the sake of clarity. Similarly, in FIG. 6, second wiring patterns 32 and second ground part 34 described later are shaded with dots for the sake of clarity.

As shown in FIG. 5, first wiring pattern 31 is disposed on first surface 30a of board 30. More specifically, first wiring pattern 31 is planar and spreads over first surface 30a.

First wiring pattern 31 is disposed, on first surface 30a, in a region where LED elements 40 are implemented, and is electrically connected to terminals (not shown) of LED elements 40. Moreover, first wiring pattern 31 is configured to connect LED elements 40 in series.

As shown in FIG. 6, second wiring patterns 32 are disposed on second surface 30b of board 30. More specifically, second wiring patterns 32 are planar and spread over second surface 30b.

Second wiring patterns 32 are horizontally spaced from each other. More specifically, second wiring patterns 32 are disposed, on second surface 30b, opposite to LED elements 40 implemented on first surface 30a via board 30. Moreover, second wiring patterns 32 are electrically connected to connectors 41.

Furthermore, board 30 includes first ground part 33 and second ground part 34 that are connected to the ground potential. Each of first ground part 33 and second ground part 34 is made of a conductive metal, such as copper foil.

First ground part 33 is a planar pattern spreading over first surface 30a. First ground part 33 is disposed to enclose first wiring pattern 31 and spaced from an outer edge of first wiring pattern 31.

Second ground part 34 is a planar pattern spreading over second surface 30b. Second ground part 34 is disposed to enclose second wiring patterns 32 and spaced from outer edges of second wiring patterns 32.

Board 30 includes through holes 35 and through holes 36. Each of through holes 35 and through holes 36 is made of a conductive metal, such as copper foil, and penetrates board 30 in a direction of thickness.

Each of through holes 35 is disposed in a region where first wiring pattern 31 and second wiring pattern 32 overlap in the direction of thickness of board 30. This allows first wiring pattern 31 and second wiring pattern 32 to be electrically connected. In addition, first wiring pattern 31 and second wiring pattern 32 are thermally coupled via through holes 35.

Each of through holes 36 is disposed in a region where first ground part 33 and second ground part 34 overlap in the direction of thickness of board 30. This allows first ground part 33 and second ground part 34 to be electrically connected. In addition, first ground part 33 and second ground part 34 are thermally coupled via through holes 36.

LED Element

As shown in FIG. 4 and FIG. 5, LED elements 40 are configured to emit illumination light ahead of imaging device 1, that is, in an imaging direction of camera 20.

LED elements 40 are disposed on first surface 30a of board 30. LED elements 40 are horizontally spaced from each other on first surface 30a of board 30 and electrically connected to first wiring pattern 31. First wiring pattern 31 connects LED elements 40 in series.

First and Second Heat Dissipation Members

As shown in FIG. 4, first heat dissipation member 50 and second heat dissipation members 60 are configured to dissipate heat generated at least by board 30. For first heat dissipation member 50 and second heat dissipation members 60, a material having a high thermal conductivity is suitable. More specifically, first heat dissipation member 50 and second heat dissipation members 60 are made of die-cast aluminum or die-cast zinc. In other words, first heat dissipation member 50 and second heat dissipation members 60 are made of a conductive material, such as a metal.

Figure 9:
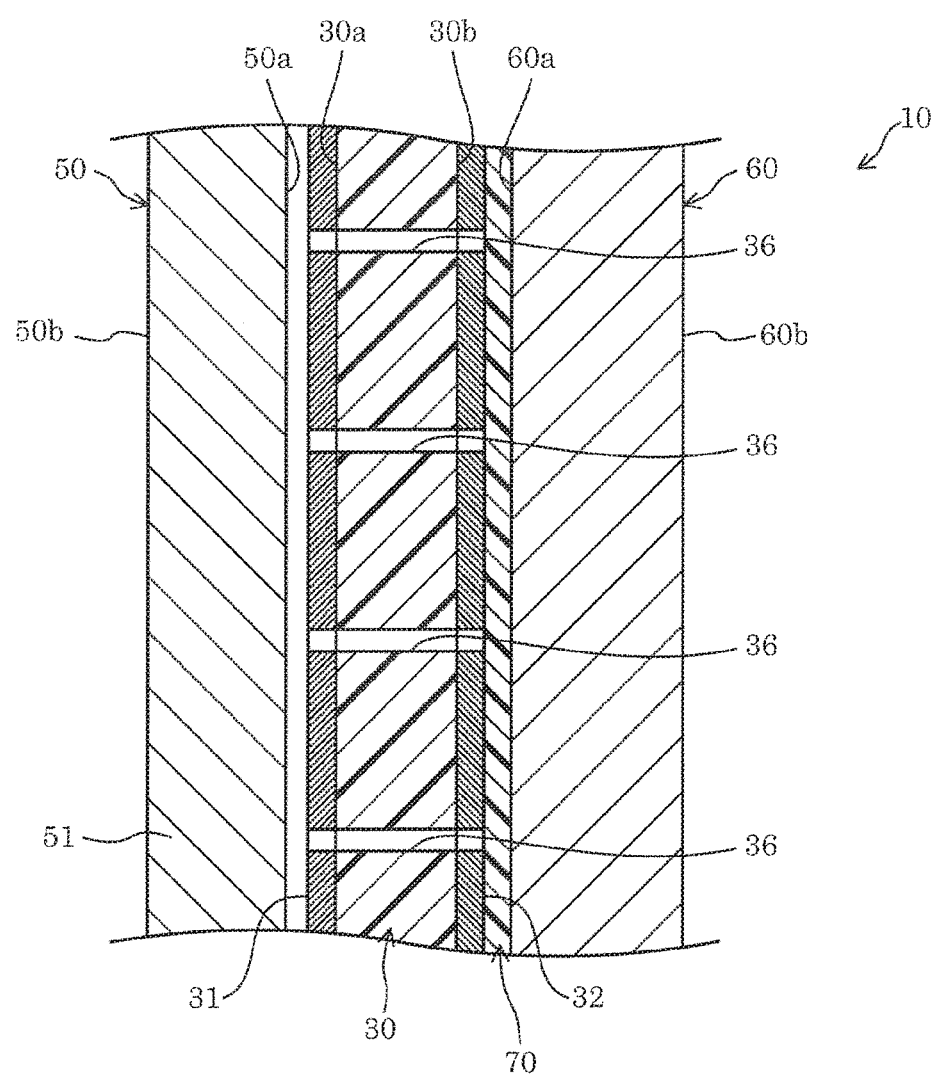
FIG. 9 is a partially-enlarged sectional view of the board mounted to the first heat dissipation member and a second heat dissipation member in a region where a first wiring pattern and a second wiring pattern are disposed.
Figure 10:
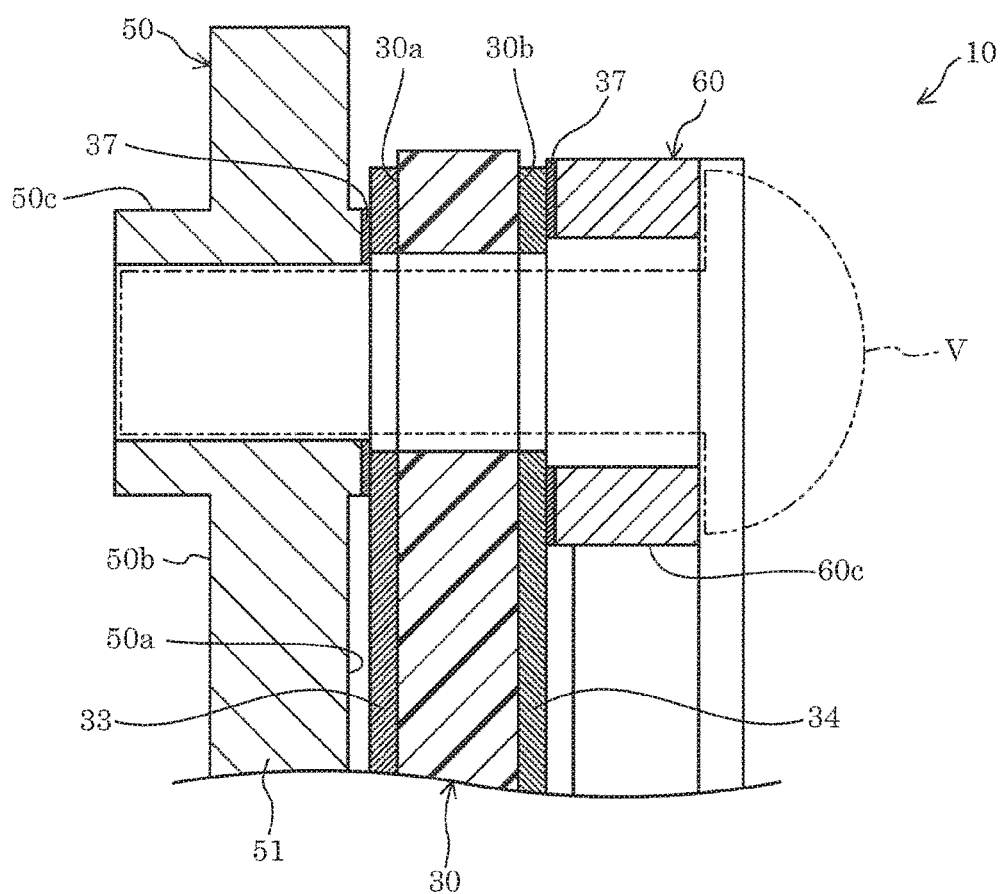
FIG. 10 is a partially-enlarged sectional view of the board mounted to the first heat dissipation member and the second heat dissipation member in a region where a first ground part and a second ground part are disposed.

While first heat dissipation member 50 is disposed opposite to first surface 30a (on which LED elements 40 are implemented) of board 30, second heat dissipation members 60 are disposed opposite to second surface 30b of board 30 (see FIG. 9 and FIG. 10). Board 30 is interposed and fastened between first heat dissipation member 50 opposite to first surface 30a and second heat dissipation members 60 opposite to second surface 30b.

As shown in FIG. 7 to FIG. 10, first heat dissipation member 50 includes base 51 that is substantially flat. Base 51 has heat transfer surface 50a on a back side and heat dissipation surface 50b on a front side. Heat transfer surface 50a of base 51 is fastened to be heat-transferable and opposite to first surface 30a of board 30. Heat dissipation surface 50b is capable of transferring, ahead of imaging unit 10, heat transferred from first surface 30a of board 30 to heat transfer surface 50a.

Figure 8:
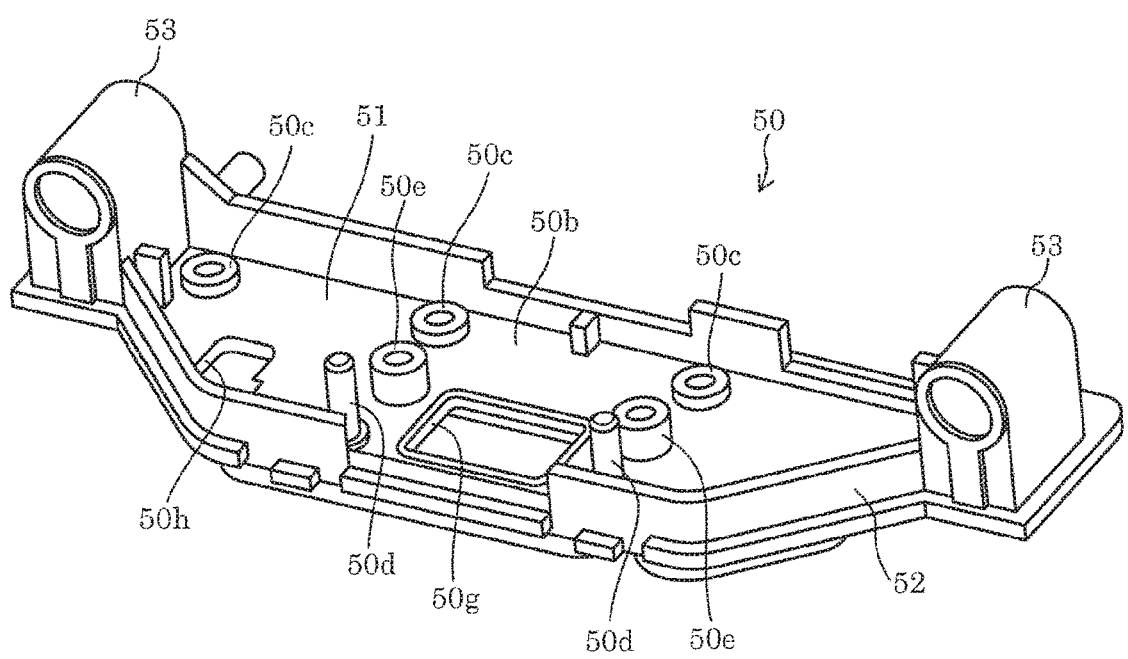
FIG. 8 is a rear perspective view of the first heat dissipation member.

Base 51 has peripheral wall 52 disposed at an outer edge of heat transfer surface 50a and extending backward from heat transfer surface 50a (see FIG. 8). Moreover, base 51 includes mounts 53 disposed in right and left end parts of heat transfer surface 50a and protruding backward from heat transfer surface 50a. Mounts 53 fasten bracket 104, which is described later, via screws.

Base 51 includes screw fastening parts 50c for fastening board 30 and second heat dissipation members 60 to first heat dissipation member 50. Each of screw fastening parts 50c is cylindrical and protrudes from heat transfer surface 50a and heat dissipation surface 50b of base 51.

Pins 50d, which are a pair of right and left pins, protrude from heat transfer surface 50a. Pins 50d are insertable into pin insertion holes 30d of board 30 (see FIG. 5 and FIG. 6) and into pin insertion holes 60d, described later, of second heat dissipation member 60 (see FIG. 4). Pins 50d make it easy to align board 30 with first heat dissipation member 50 and second heat dissipation members 60.

As shown in FIG. 8, bosses 50e, which are a pair of right and left bosses, protrude from heat transfer surface 50a. Bosses 50e are insertable into boss insertion holes 30e of board 30 (see FIG. 5 and FIG. 6). Screws V inserted in holes of screw mounts 24 from behind of camera 20 engage with bosses 50e inserted in boss insertion holes 30e of board 30. This engagement fastens camera 20 to board 30 and first heat dissipation member 50 (see FIG. 4).

First heat dissipation member 50 includes projections 50f. Each of projections 50f projects from an inner surface of mount 53 toward a horizontal center of base 51.

First heat dissipation member 50 includes lens opening 50g. Lens opening 50g penetrates a substantially horizontal center of base 51 in a direction of thickness and is substantially rectangular. Lens opening 50g allows lens 23 to be exposed at the front side of imaging device 1, with camera 20 fastened to first heat dissipation member 50.

First heat dissipation member 50 includes a plurality of (four in an example shown in FIG. 4) LED openings 50h. LED openings 50h penetrate base 51 in the direction of thickness. Each of LED openings 50h is substantially rectangular and disposed in alignment with LED element 40 implemented on first surface 30a of board 30. Each of LED openings 50h allows illumination light from LED element 40 to be transmitted ahead of imaging device 1.

First heat dissipation member 50 includes fins 54 for enlarging a heat dissipation area. Fins 54 are spaced from each other on heat dissipation surface 50b of base 51, and protrude in one piece. To be more specific, as shown in FIG. 14, each of fins 54 is a substantially square pillar extending vertically, and air A flows vertically along each side of fin 54 by natural convection. In other words, air A flowing around fins 54 cools first heat dissipation member 50.

Figure 7:
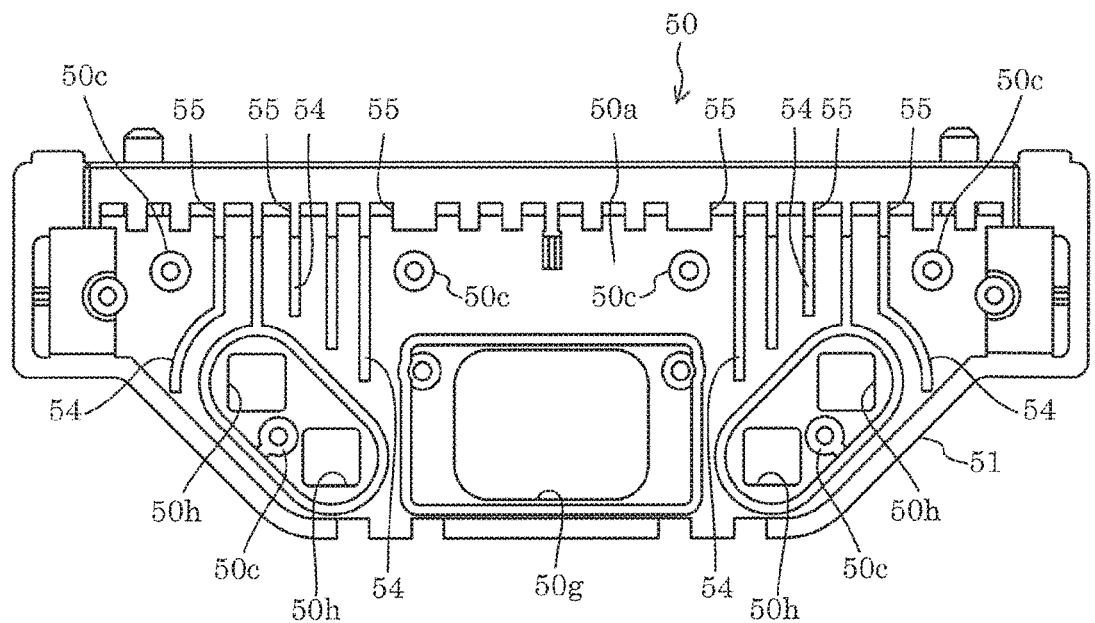
FIG. 7 is a front view of a first heat dissipation member.

As shown in FIG. 7, first heat dissipation member 50 includes fin openings 55. Fin openings 55 are disposed in an upper portion of base 51 in the direction of gravity and penetrate base 51 in the direction of thickness. Fin openings 55 are spaced horizontally from each other in the upper portion of base 51. To be more specific, each of fin openings 55 is disposed in alignment with a space between fins 54 in the horizontal direction (see FIG. 14). In other words, fin openings 55 are displaced in the horizontal direction with respect to upper ends of fins 54 in the direction of gravity.

As shown in FIG. 4, second heat dissipation members 60 are disposed as a pair in the horizontal direction. Each of second heat dissipation members 60 is disposed in a region including an area opposite to LED element 40 via board 30.

Each of second heat dissipation members 60 is substantially flat. As shown in FIG. 9, each of second heat dissipation members 60 has heat transfer surface 60a on a front side and heat dissipation surface 60b on a back side.

Each of second heat dissipation members 60 is fastened to board 30 to be heat-transferable, with heat transfer surface 60a opposite to second surface 30b of board 30. Heat dissipation surface 60b is capable of dissipating heat transferred from second surface 30b of board 30 to heat transfer surface 60a of second heat dissipation member 60.

Each of second heat dissipation members 60 includes screw mounts 60c. Screws V inserted in screw mounts 60c of second heat dissipation members 60 from behind and also inserted m screw insertion holes 30c of board 30 engage with screw fastening parts 50c inserted in screw insertion holes 30c of board 30. This engagement fastens second heat dissipation members 60 to board 30 and first heat dissipation member 50.

Moreover, second heat dissipation members 60 include pin insertion holes 60d for receiving pins 50d of first heat dissipation member 50.

First heat dissipation member 50 and second heat dissipation members 60 are fastened to board 30 to cover at least first wiring pattern 31 and second wiring patterns 32. For example, first heat dissipation member 50 may fully cover first wiring pattern 31 in plan view. Alternatively, first heat dissipation member 50 may partially cover first wiring pattern 31. For example, second heat dissipation members 6 may fully cover second wiring patterns 32 in plan view. Alternatively, second heat dissipation members 6 may partially cover second wiring patterns 32. Moreover, first heat dissipation member 50 may cover second wiring patterns 32, and second heat dissipation members 60 may cover first wiring pattern 31. In this way, first heat dissipation member 50 and second heat dissipation members 60 cover first wiring pattern 31 and second wiring patterns 32. This reduces influence of electromagnetic noise to be caused to camera 20 by first wiring pattern 31 and second wiring patterns 32.

Heat Dissipation Sheet

As shown in FIG. 4, imaging unit 10 includes heat dissipation sheets 70. Each of heat dissipation sheets 70 is a thin film made of a material having heat dissipation and electrical insulation properties. As also shown in FIG. 9, each of heat dissipation sheets 70 is interposed between second wiring pattern 32 and heat transfer surface 60a of second heat dissipation member 60 and capable of transferring heat generated by board 30 and LED elements 40 to second heat dissipation member 60.

Thermally Coupled Structure

As shown in FIG. 9, second heat dissipation member 60 has heat dissipation surface 60a contacting second wiring pattern 32 via heat dissipation sheets 70. To be more specific, second heat dissipation member 60 is thermally coupled to second wiring pattern 32.

Moreover, as shown in FIG. 10, an end surface of screw fastening part 50c, which is on heat transfer surface 50a of first heat dissipation member 50, is in contact with first ground part 33 via bond part 37 made of, for example, solder. To be more specific, first heat dissipation member 50 is thermally coupled to first ground part 33. Furthermore, an end surface of screw mount 60c, which is on heat transfer surface 60a of second heat dissipation member 60, is in contact with second ground part 34 via bond part 37. To be more specific, second heat dissipation member 60 is thermally coupled to second ground part 34.

As shown in FIG. 5 and FIG. 6, first wiring pattern 31 is thermally coupled to second wiring patterns 32 via through holes 35. First ground part 33 is thermally coupled to second ground part 34 via through holes 36. More specifically, first heat dissipation member 50 and second heat dissipation members 60 are thermally coupled via through holes 35 and through holes 36 of board 30.

In Embodiment, bond part 37 made of, for example, solder can retard erosion progression of the bonded portion between the end surface of screw fastening part 50c of first heat dissipation member 50 and first ground part 33. Similarly, bond part 37 can retard erosion progression of the bonded portion between the end surface of screw mount 60c of second heat dissipation member 60 and second ground part 34.

Figure 11:
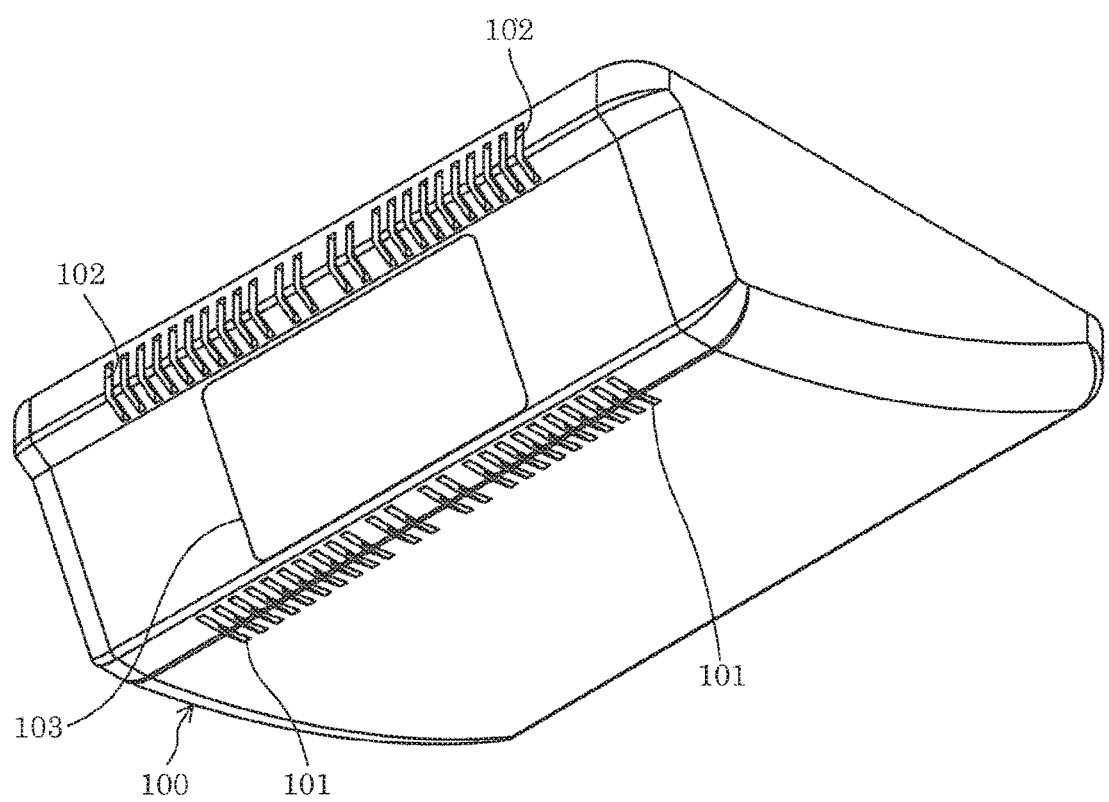
FIG. 11 is a bottom perspective view of an overhead console inside a vehicle.
Figure 12:
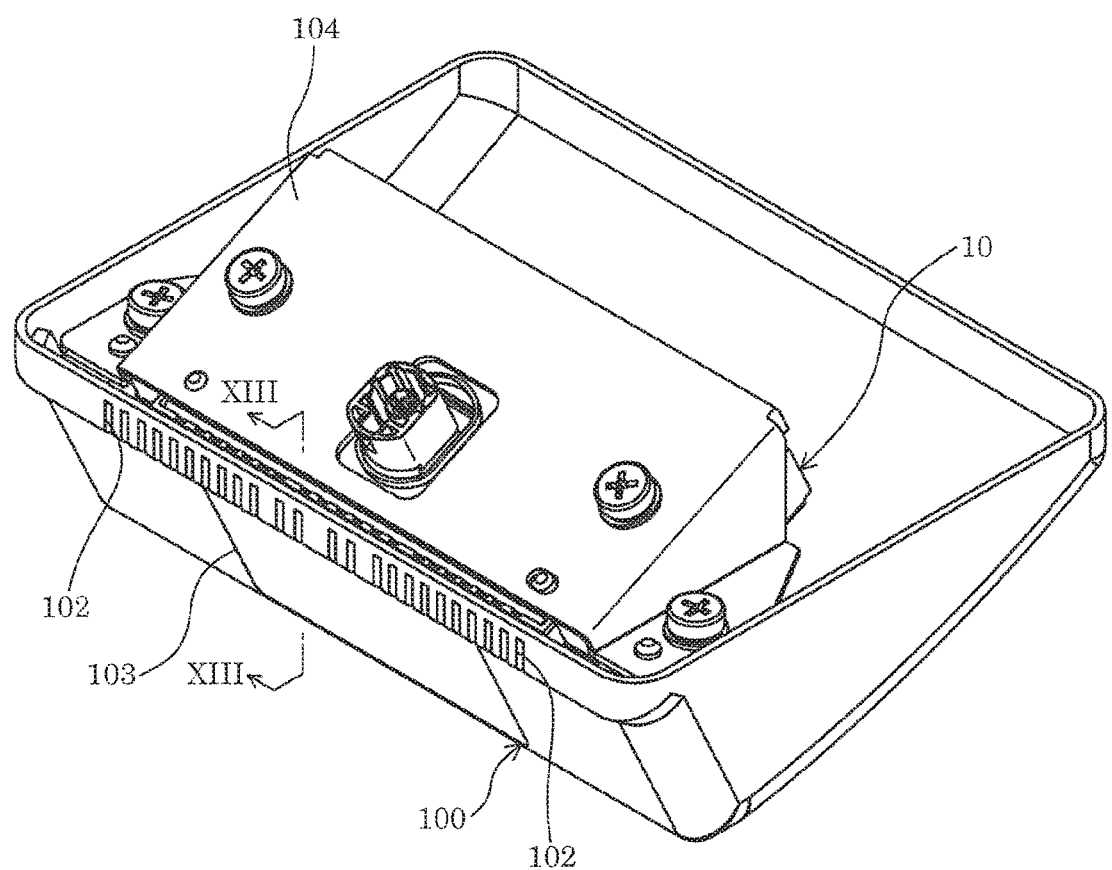
FIG. 12 is a top perspective view of an installation structure in which the imaging device according to Embodiment is installed inside the overhead console.
Figure 13:
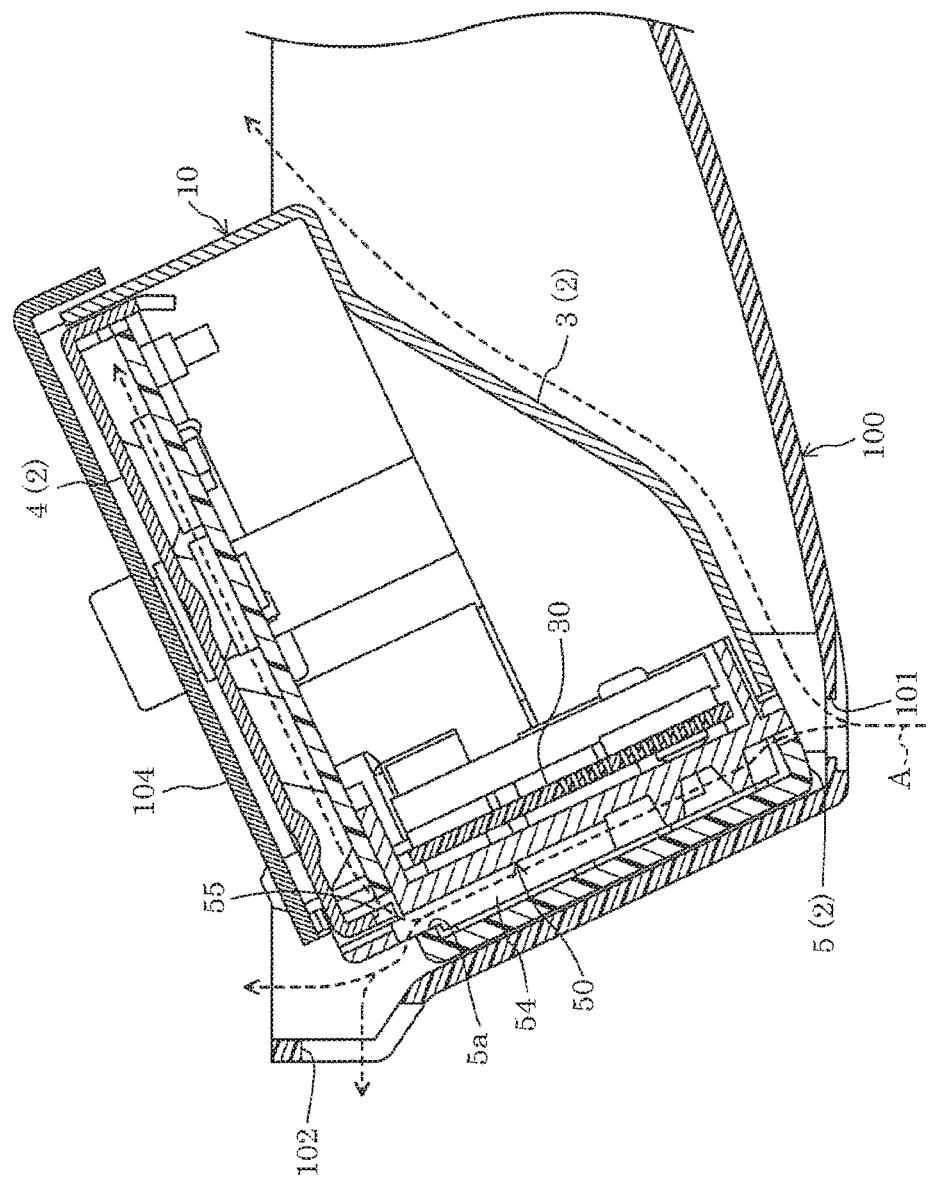
FIG. 13 is a cross-sectional view taken along line XIII-XIII of FIG. 12.
Figure 14:
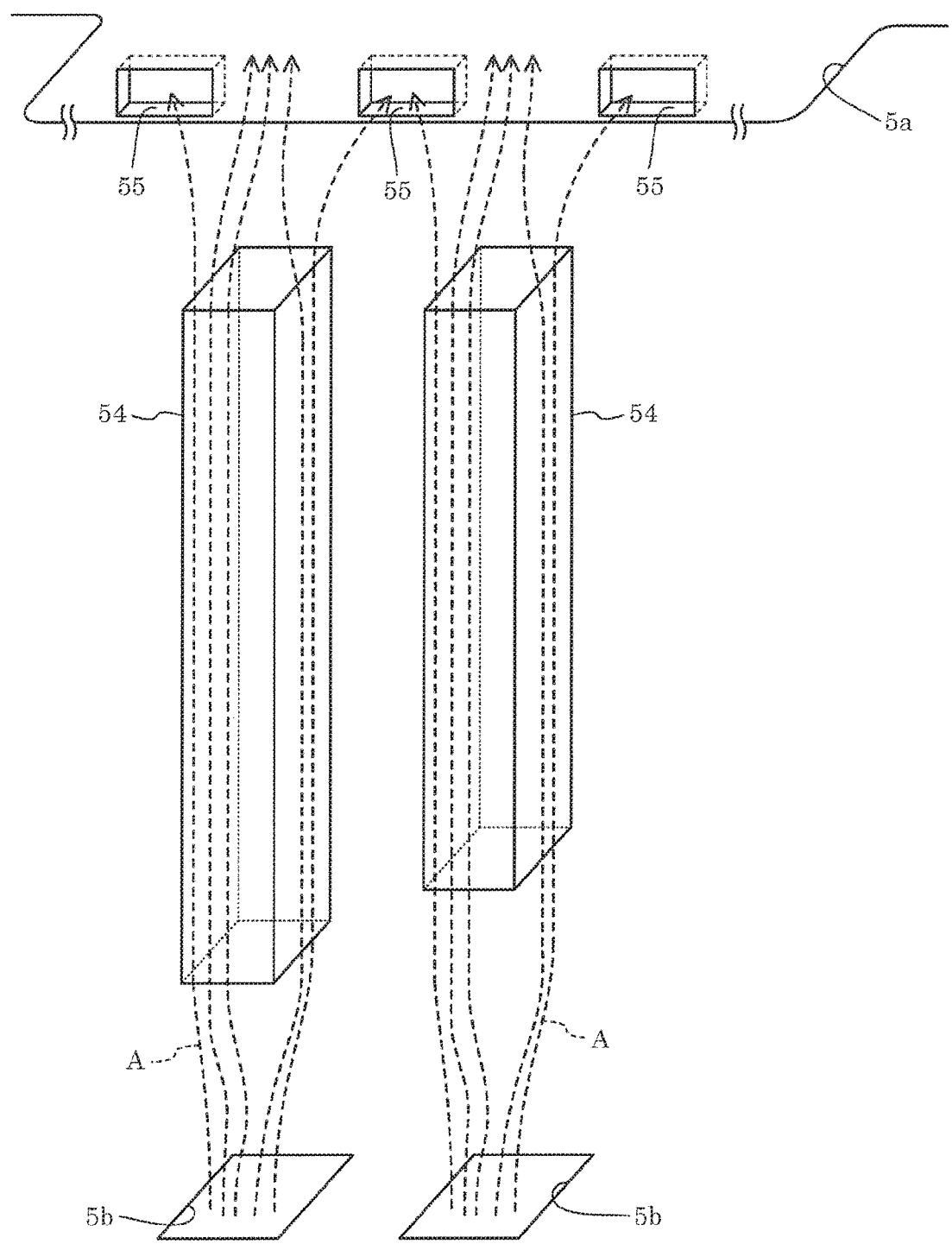
FIG. 14 is a schematic partially-enlarged view of air by natural convection around fins.

Installation structure FIG. 11 to FIG. 13 are installation views of imaging device 1 installed in overhead console 100 inside the vehicle.

As shown in FIG. 11 to FIG. 13, lower slits 101 each having a long narrow substantially rectangular shape are disposed in a bottom portion of overhead console 100. Moreover, upper slits 102 each having a long narrow substantially rectangular shape are disposed in an upper portion of a front surface of overhead console 100.

Furthermore, transmission part 103 made of a resin sheet capable of transmitting mainly infrared rays is disposed on the front surface of overhead console 100. Transmission part 103 allows illumination light from LED elements 40 of imaging device 1 to be transmitted ahead of overhead console 100.

As shown in FIG. 12 and FIG. 13, imaging device 1 is fastened to overhead console 100 with bracket 104. Bracket 104 is configured to fasten imaging device 1 into overhead console 100 in a manner that inclines imaging device 1 at a predetermined angle downwardly with respect to the horizontal direction.

For application of imaging device 1 to a regular car, for example, imaging device 1 may be inclined by bracket 104 at a 30-degree angle downwardly with respect to the horizontal direction. Basically, imaging device 1 may be installed in overhead console 100 so as to image a head area of the passenger sitting in the seat of the vehicle.

The inclination of imaging device 1 at the predetermined angle allows the front surface of overhead console 100 to incline. With this, water droplets entering from an upper portion of overhead console 100 can be easily drawn out toward lower slits 101 through a back side of the front surface of overhead console 100. More specifically, water droplets caused from, for example, condensation within the vehicle are prevented from entering imaging device 1 installed in overhead console 100.

As shown in FIG. 13, for imaging device 1 installed in overhead console 100, air A passing through lower slits 101 flows in toward lower openings 5b of front cover 5.

Air A flowing in lower openings 5b next passes between front cover 5 and first heat dissipation member 50 and flows toward the upper portion of imaging device 1. Then, air A flows from upper slits 102 to the outside. As also shown in FIG. 14, air A mentioned above passes between cutout opening 5a of front cover 5 and heat dissipation surface 50b of first heat dissipation member 50 and then flows to the outside of overhead console 100. Moreover, air A mentioned above passes through fin openings 55 of first heat dissipation member 50 and then flows to the outside of overhead console 100.

Furthermore, according to the above installation structure, air A passing through lower slits 101 flows along a bottom surface of cover body 3 (cover member 2) of imaging device 1 and then to the outside of overhead console 100.

In this way, the above installation structure allows air A passing through lower slits 101 to flow to the outside of overhead console 100 in different directions.

Operational Advantage According to Embodiment

Imaging device 1 includes LED elements 40 electrically connected to the wiring patterns (first wiring pattern 31 and second wiring patterns 32) on first surface 30a of board 30. Thus, heat generated by LED elements 40 due to power consumption for emitting illumination light is transferred from LED elements 40 to board 30. With this heat, the wiring patterns disposed on board 30 easily reach a high temperature. However, imaging device 1 includes board 30 fastened between first heat dissipation member 50 disposed opposite to first surface 30a and second heat dissipation members 60 disposed opposite to second surface 30b. First heat dissipation member 50 and second heat dissipation members 60 allow heat generated at least by board 30 to be dissipated simultaneously from first surface 30a and second surface 30b. Moreover, each of second heat dissipation members 60, which is disposed in the region including the area opposite to LED element 40 via board 30, is capable of directly dissipating heat generated by LED element 40. Thus, for imaging device 1 according to Embodiment, heat generated by board 30 mainly due to LED elements 40 can be dissipated efficiently. This yields a highly reliable operating environment even if board 30 reaches a high temperature.

Furthermore, first heat dissipation member 50 and second heat dissipation members 60 are thermally coupled via board 30. This structure disperses heat generated by board 30 toward both first heat dissipation member 50 and second heat dissipation members 60, and thus dissipates this heat efficiently.

Moreover, first wiring pattern 31 and second wiring patterns 32 are thermally coupled via through holes 35. This structure disperses heat generated by board 30 toward both first wiring pattern 31 and second wiring patterns 32, and thus reduces an unbalanced effect of heat dissipation by first heat dissipation member 50 and second heat dissipation members 60.

Furthermore, each of heat dissipation sheets 70 interposed between second wiring pattern 32 and second heat dissipation member 60 allows heat generated by board 30 and LED elements 40 to be transferred efficiently to second heat dissipation members 60.

Moreover, first heat dissipation member 50 includes fins 54 that are cooled by air A. Fins 54 protrude in one piece and are spaced from each other on heat dissipation surface 50b. Fins 54 allow first heat dissipation member 50 reaching a high temperature due to heat from board 30 via base 51 to be cooled by natural convection of air A (see FIG. 14). Hence, heat generated by board 30 is transferred from heat transfer surface 50a of base 51 to fins 54 on heat dissipation surface 50b to be dissipated efficiently.

Furthermore, fins 54 are designed to extend in parallel with each other in the direction of gravity. This design achieves smooth natural convection of air A. Thus, fins 54 allow heat generated by board 30 to be dissipated efficiently.

Moreover, first heat dissipation member 50 includes fin openings 55. This structure allows air A by natural convection near fins 54 to flow toward fin openings 55 disposed in base 51, and thus further enhances natural convention of air A.

Furthermore, each of fin openings 55 is disposed between fins 54 according to Embodiment. Such arrangement allows air A by natural convection near fins 54 to smoothly flow toward fin openings 55, and thus further enhances natural convection of air A.

Moreover, front cover 5 includes lower openings 5b disposed below and opposite to the lower ends of fins 54. With this structure, air A by natural convection from lower openings 5b, which are inlets, toward and near fins 54 can be easily taken in. As a result, air A by natural convection smoothly flows in a longitudinal direction of surfaces of fins 54, and thus heat generated by board 30 is dissipated efficiently.

Variation 1 of Embodiment

In Embodiment described above, the upper end of front cover 5 is below the upper end of first heat dissipation member 50. However, this is not intended to be limiting. For example, imaging device 1 according to Variation 1 as shown in FIG. 15 may include front cover 5 having an upper end flush with an upper end of first heat dissipation member 50.

Figure 15:
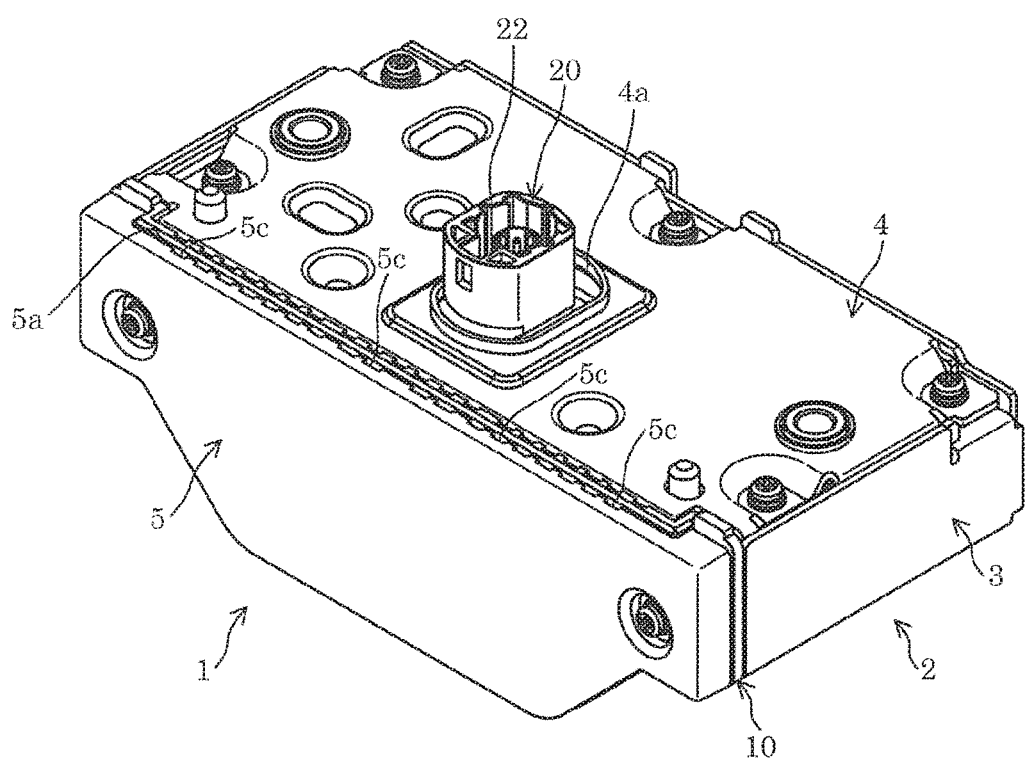
FIG. 15 is a view of an imaging device according to Variation 1 of Embodiment, corresponding to FIG. 1.

Moreover, upper openings 5c are disposed in the upper end of front cover 5 according to Variation 1 as shown in FIG. 15. Each of upper openings 5c has a square U-shape. To make this shape, the upper end of front cover 5 is partially cut our forward from a side edge of cutout opening 5a. Upper openings 5c are horizontally spaced from each other in plan view, and allow spaces between the upper end of front cover 5 and the upper end of first heat dissipation member 50.

Figure 16:
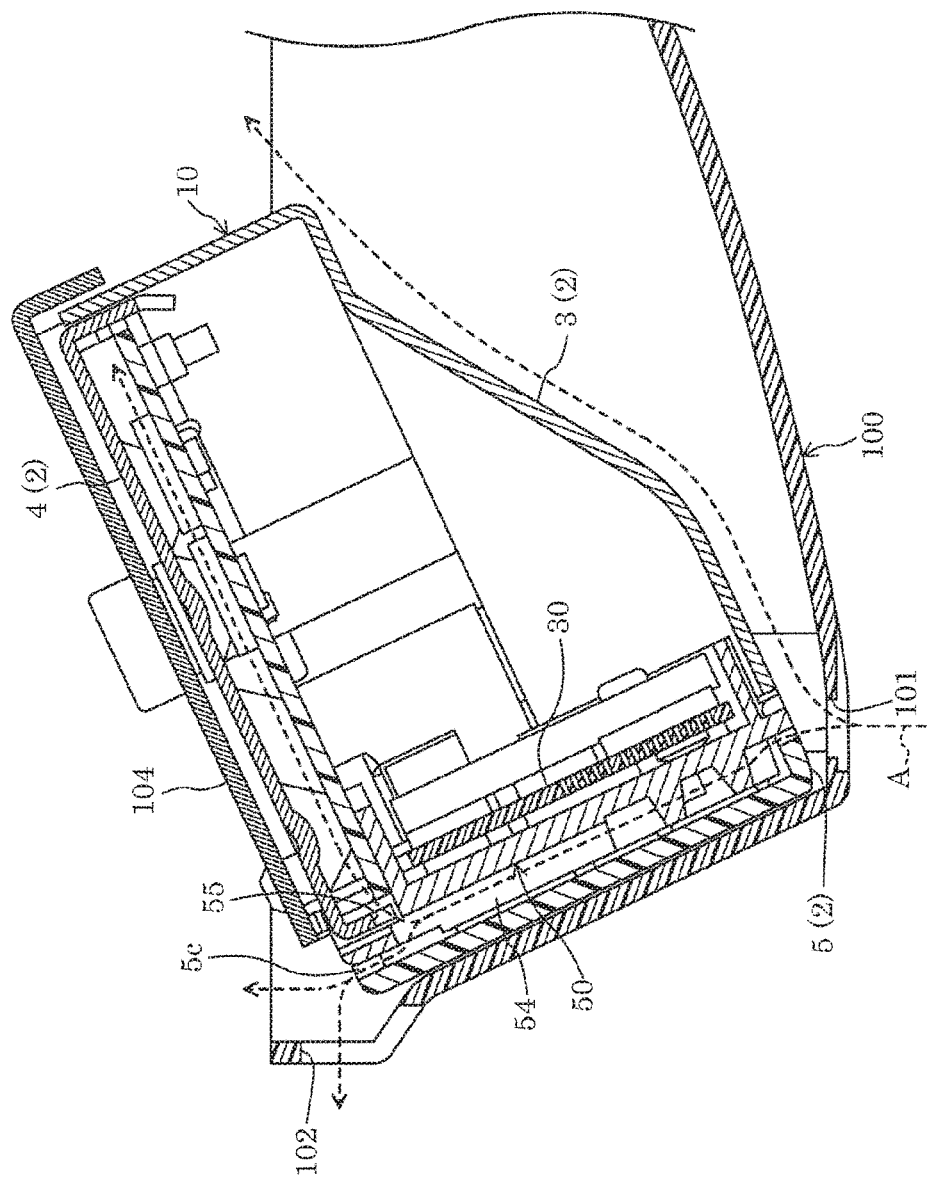
FIG. 16 is a top view of an installation structure in which the imaging device according to Variation 1 of Embodiment is installed inside an overhead console, corresponding to FIG. 13.

Imaging device 1 according to Variation 1 is installed in overhead console 100 as shown in FIG. 16. This installation structure allows air A passing through lower slits 101 to smoothly flow from the aforementioned spaces toward the outside of overhead console 100.

Figure 17:
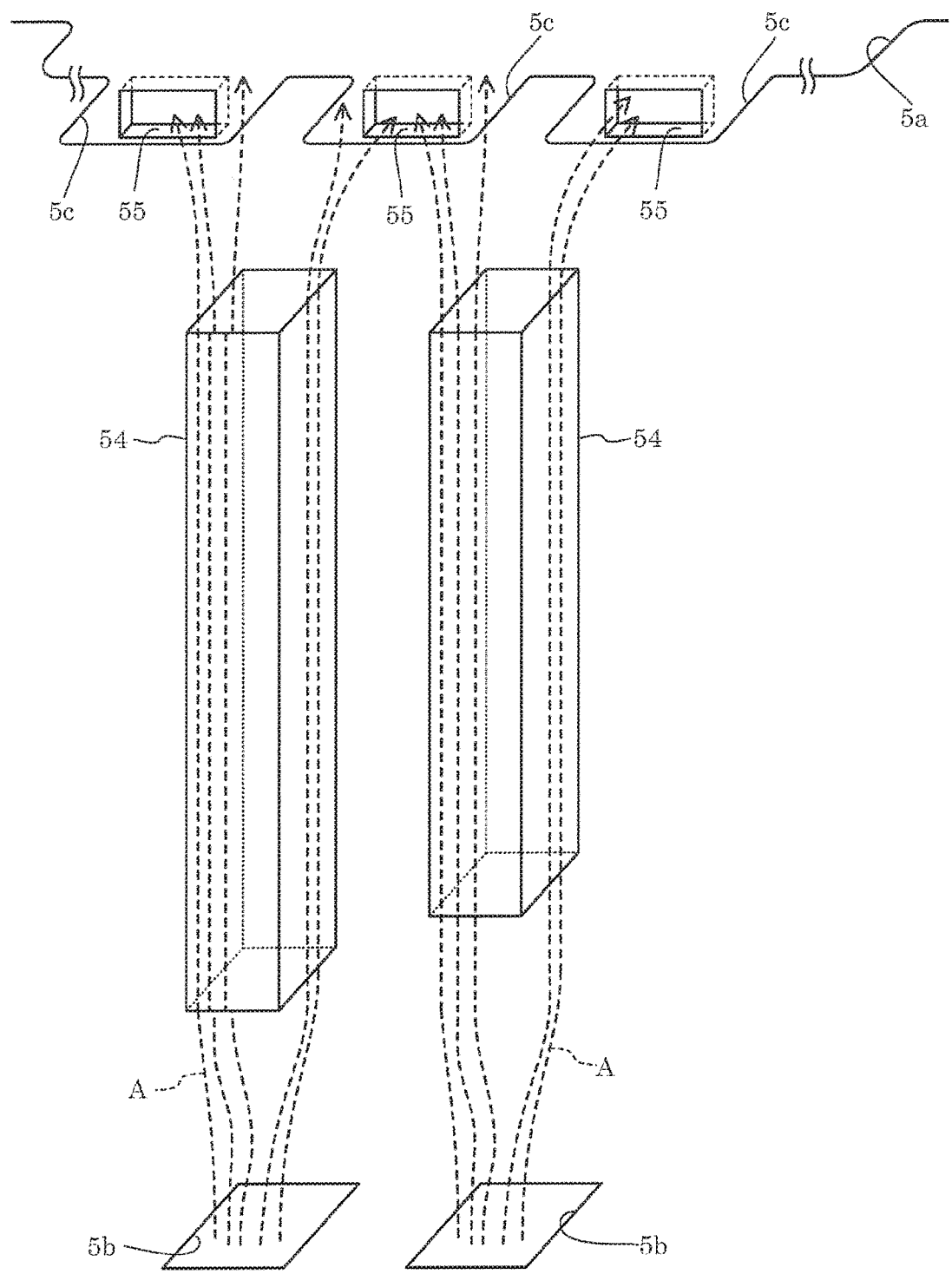
FIG. 17 is a schematic view of air by natural convection around fins according to Variation 1 of Embodiment, corresponding to FIG. 14.

Moreover, as shown in FIG. 17, each of upper openings 5c is disposed above the upper ends of fins 54 in the direction of gravity and in alignment with a space between fins 54, with front cover 5 fastened to first heat dissipation member 50. In other words, upper openings 5c are displaced in the horizontal direction with respect to the upper ends of fins 54, as in the case of fin openings 55. Thus, air A passing through lower slits 101 passes through both fin openings 55 and upper openings 5c and then smoothly flows to the outside of overhead console 100.

Variation 2 of Embodiment

Figure 18:
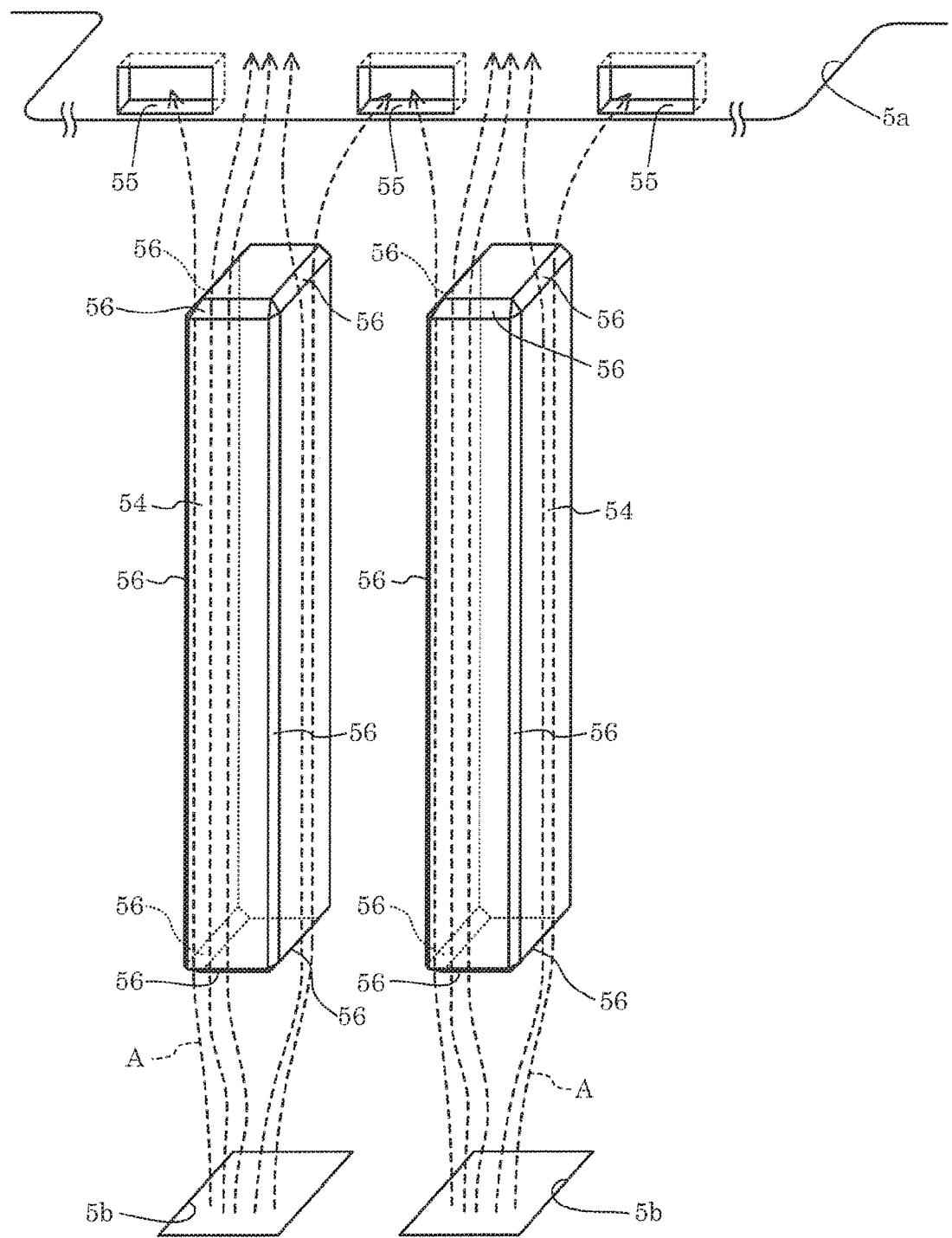
FIG. 18 is a schematic view of air by natural convection around fins according to Variation 2 of Embodiment, corresponding to FIG. 14.

FIG. 18 is a view of imaging device 1 according to Variation 2 of Embodiment. Fins 54 according to Variation 2 are partially different in shape from fins 54 according to Embodiment described above. In the following, the same components as those in FIG. 1 to FIG. 14 are assigned the same numerals as in FIG. 1 to 14, and detailed description on these components is omitted here.

As shown in FIG. 18, chamfer 56 is formed at each corner where an upper or lower end surface of fin 54 (that is, a top or bottom surface of a square pillar) and an adjacent side surface meet. Moreover, chamfer 56 is also formed at each corner where two adjacent side surfaces meet.

As compared with fin 54 that is a square pillar having no chamfer, fin 54 having chamfers 56 has a larger surface area. This means that an area of contact between fins 54 and air A by natural convection increases. Thus, imaging device 1 according to Variation 2 enhances heat dissipation and is capable of dissipating heat generated by board 30 more efficiently.

According to Variation 2, chamfers 56 may be formed only at the corners where the upper or lower end surface of fin 54 (that is, the top or bottom surface of the square pillar) and adjacent side surfaces meet. Alternatively, chamfers 56 may be formed only at the corners where two adjacent side surfaces meet.

Variation 3 of Embodiment

Next, Variation 3 of Embodiment is described.

An imaging device according to Variation 3 of Embodiment is different from imaging device 1 according to Embodiment in that first heat dissipation member 50 and second heat dissipation member 160 are thermally insulated from camera 20. Moreover, the imaging device according to Variation 3 of Embodiment is different from imaging device 1 according to Embodiment in a structure of second heat dissipation member 160.

Figure 19:
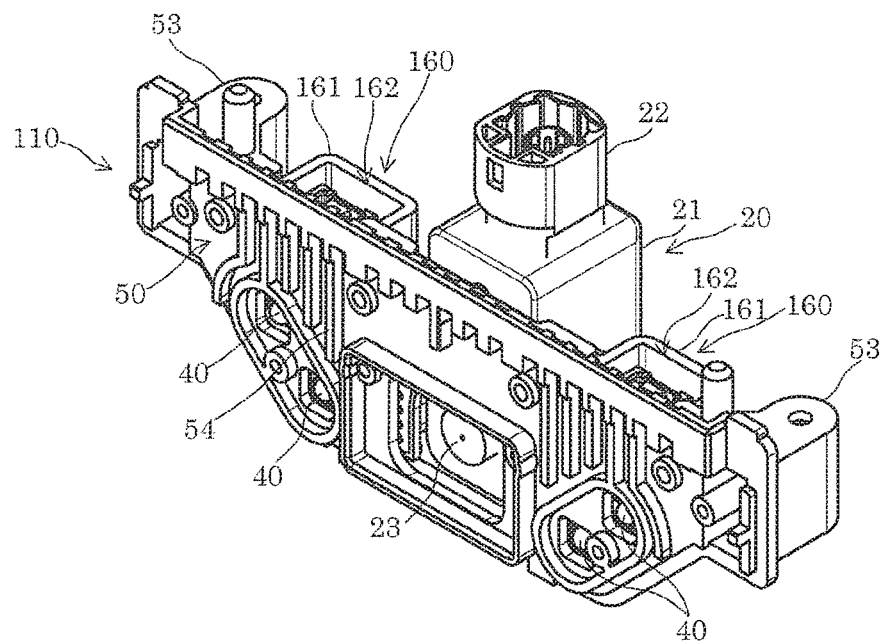
FIG. 19 is a front perspective view of an imaging unit of an imaging device according to Variation 3 of Embodiment.
Figure 20:
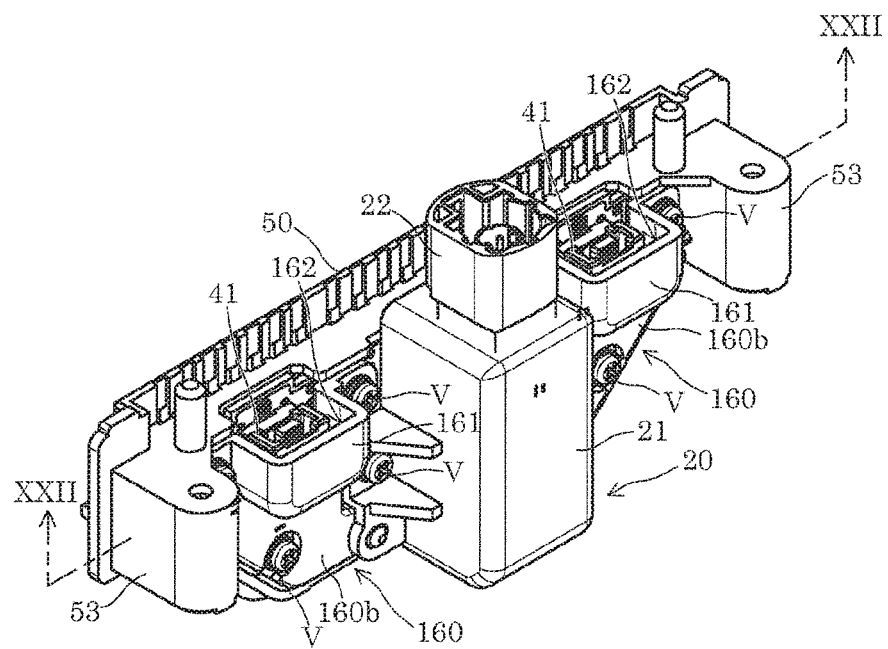
FIG. 20 is a rear perspective view of the imaging unit of the imaging device according to Variation 3 of Embodiment.
Figure 21:
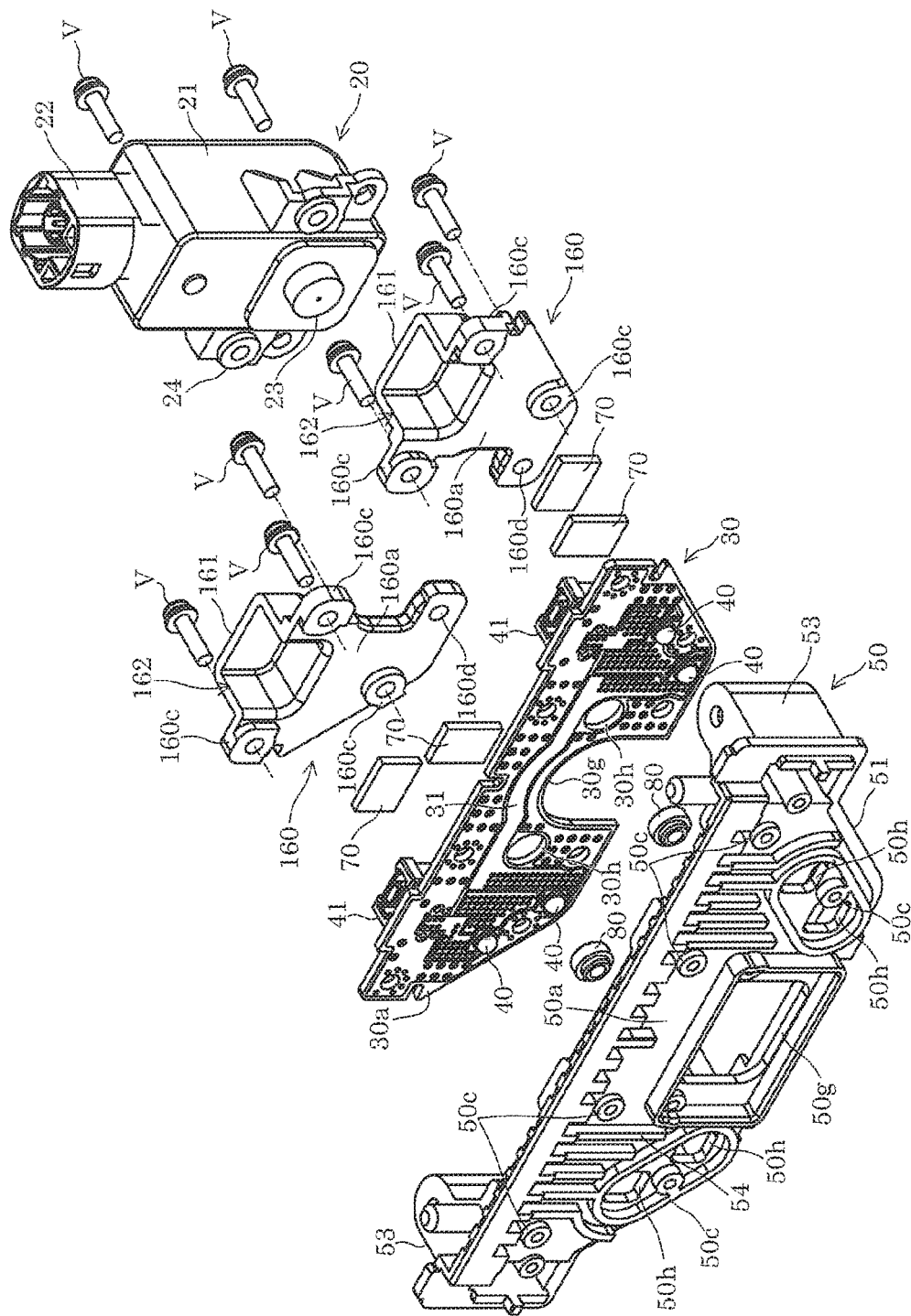
FIG. 21 is an exploded perspective view of the imaging unit according to Variation 3 of Embodiment.

The following mainly describes components of the imaging device according to Variation 3 of Embodiment that are different from those of imaging device 1 according to Embodiment, with reference to FIG. 19 to FIG. 21. The other components of the imaging device according to Variation 3 of Embodiment are the same as those of imaging device 1 according to Embodiment. The same components as those of imaging device 1 are assigned the same numerals as in Embodiment, and detailed description on these components is omitted here.

FIG. 19 is a front perspective view of imaging unit 110 of the imaging device according to Variation 3 of Embodiment. FIG. 20 is a rear perspective view of imaging unit 110 of the imaging device according to Variation 3 of Embodiment. FIG. 21 is an exploded perspective view of imaging unit 110 according to Variation 3 of Embodiment.

As shown in FIG. 19 to FIG. 21, imaging unit 110 includes second heat dissipation members 160 having shapes different from those of second heat dissipation members 60 of imaging unit 10 according to Embodiment. Moreover, imaging unit 110 further includes resin members 80 for thermally insulating first heat dissipation 50 from camera 20.

Second heat dissipation members 160 are first described. Each of heat dissipation members 160 includes heat transfer surface 160a, heat dissipation surface 160b, screw mounts 160c, pin insertion holes 160d, and case 161. Heat transfer surface 160a, heat dissipation surface 160b, screw mounts 160c, and pin insertion holes 160d have the same structures as heat transfer surface 60a, heat dissipation surface 60b, screw mounts 60c, and pin insertion holes 60d, respectively.

Case 161 covers sides of connector 41, or more specifically, covers connector 41 except for a part connected to an external wiring member. Case 161 is connected to an upper portion of second heat dissipation member 160 and to two screw mounts 160c disposed in the upper portion. Case 161 has: a wall part extending in a direction substantially orthogonal to heat transfer surface 160a and heat dissipation surface 160b and covering the sides of connector 41 except for the part connected to the external wiring member; and a wall part covering a back side of connector 41. To be more specific, case 161 covers connector 41 with planes and has opening 162 for wiring in a region of the external wiring member. Or more specifically, case 161 covers the sides of connector 41 except for the side having the connection part.

As described above, case 161 is a part of second heat dissipation member 160 made of a metal. Thus, case 161 is capable of reducing influence of electromagnetic noise caused to camera 20 by connector 41.

Connectors 41 are disposed on the back side of board 30. Instead of this, for connectors disposed on the front side of board 30, first heat dissipation member 50 in front of board 30 may include cases to cover these connectors.

Figure 22:
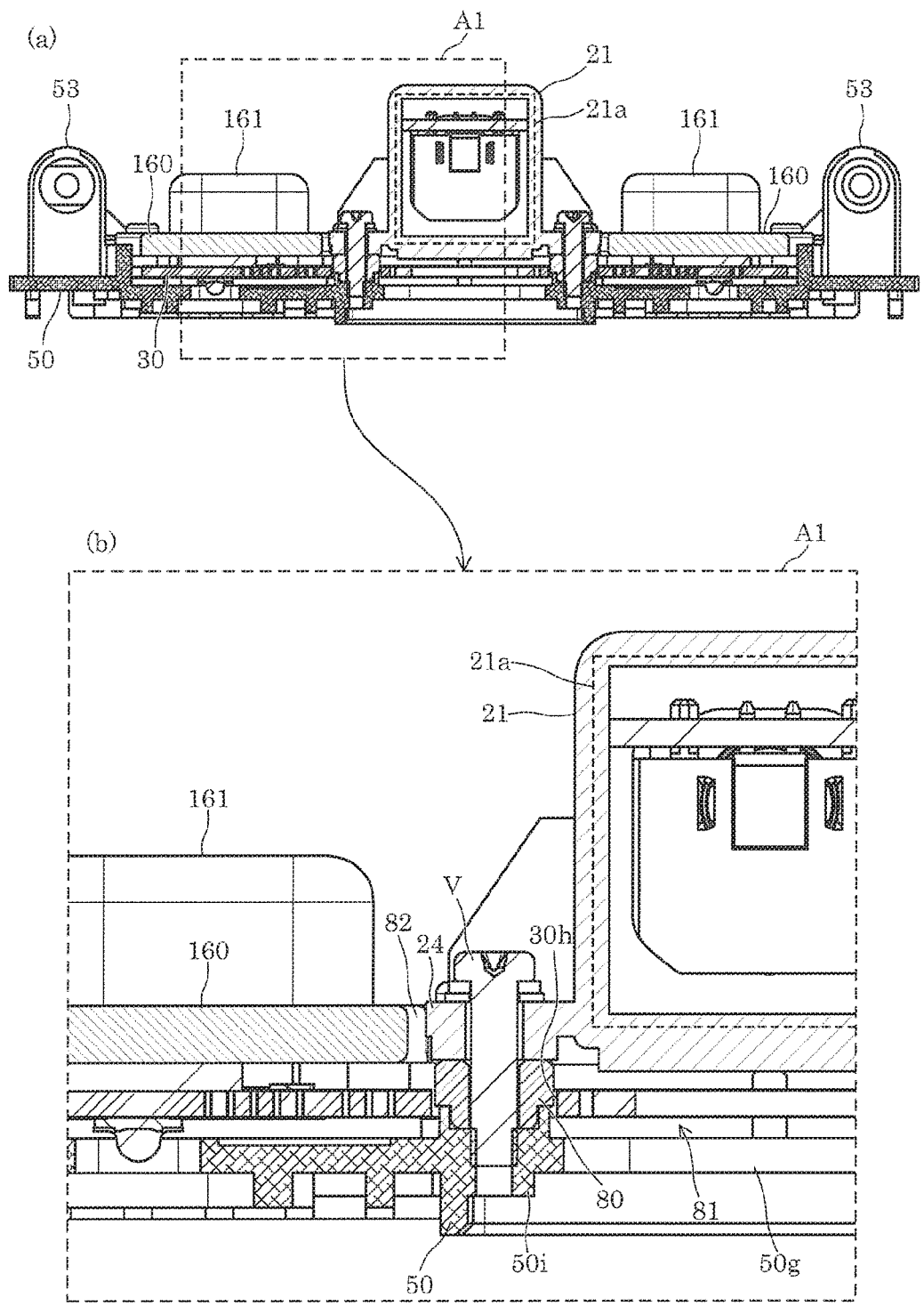
FIG. 22 is a cross-sectional view taken along line XXII-XXII of FIG. 20.

Next, a structure having heat dissipation member 50 and second heat dissipation members 160 thermally insulated from camera 20 is described, with reference to FIG. 22.

FIG. 22 is a cross-sectional view taken along line XXII-XXII of FIG. 20. In (a) of FIG. 22, an overall cross-sectional view taken along line XXII-XXII of FIG. 20 is shown. In (b) of FIG. 22, an enlarged view of area A1 in (a) of FIG. 22 is shown.

Although not mentioned in Embodiment above, camera body 21 of camera 20 may include metal shield 21a that is planar along a surface of a housing of camera body 21. Metal shield 21a may be planar to cover lens 23 and an image sensor (not shown) of camera 20. More specifically, metal shield 21a covers camera 20 except for a side surface that crosses an optical axis of camera 20. For example, metal shield 21a may be a layer disposed inside a wall of the housing of camera body 21 (that is, between an outer surface and an inner surface of the wall) as indicated by the dashed line in FIG. 22. Alternatively, metal shield 21a may be disposed on the outer or inner surface of the wall. Moreover, camera body 21 itself may be made of metal to function as metal shield 21*a*.

Here, the description returns to the structure of thermal insulation. Air layer 81 or resin member 80 is interposed between first heat dissipation member 50 and metal shield 21*a*, and air layer 82 is interposed between second heat dissipation member 160 and metal shield 21*a*. With this structure, first heat dissipation member 50 and second heat dissipation members 160 are thermally insulated from metal shield 21*a*. In other words, a space between lens opening 50*g* of first heat dissipation member 50 and camera body 21 having metal shield 21*a* is air layer 81 interposed between first heat dissipation member 50 and metal shield 21*a*. Similarly, a space between second heat dissipation member 160 and metal shield 21*a* is air layer 82 interposed between second heat dissipation member 160 and metal shield 21*a*.

Resin member 80 is interposed specifically between screw mount 24 of camera 20 and first heat dissipation member 50 to be inside through hole 30*h* of board 30. Resin member 80 interposed between first heat dissipation member 50 and metal shield 21*a* in this way thermally insulates first heat dissipation member 50 from metal shield 21*a*.

Moreover, resin member 80 includes a through hole penetrated by screw V for fastening camera 20 to board 30. Resin member 80 is disposed between, and fastened by both, first heat dissipation member 50 and metal shield 21*a* via screw V. More specifically, screw V is fastened by penetrating screw mount 24 of camera 20 and resin member 80 and then engaging with screw mount 50*i* of first heat dissipation member 50. With this, camera 20 is fastened to board 30 and to first heat dissipation member 50 while thermally insulated from first heat dissipation member 50. Hence, even for a structure having camera 20 fastened to first heat dissipation member 50 with a fastening member such as screw V, first heat dissipation member 50 can be easily thermally insulated from metal shield 21*a*.

As described, air layer 81 is interposed between first heat dissipation member 50 and metal shield 21*a*, and air layer 82 is interposed between second heat dissipation member 160 and metal shield 21*a*. However, this is not intended to be liming. For example, an air layer may be interposed only between the first heat dissipation member and the metal shield or only between the second heat dissipation member and the metal shield. In other words, at least one of the first and second heat dissipation members may be thermally insulated from the metal shield by the air layer interposed between the at least one of the first and second heat dissipation members and the metal shield. Thus, thermal insulation is achieved with a simple structure.

Although resin member 80 is interposed between first heat dissipation member 50 and metal shield 21*a*, this is not intended to be limiting. Resin member 80 may be further interposed between second heat dissipation member 160 and metal shield 21*a*. Alternatively, resin 80 may be interposed between second heat dissipation 160 and metal shield 21*a*, instead of between first heat dissipation member 50 and metal shield 21*a*. In other words, at least one of the first and second heat dissipation members may be thermally insulated from the metal shield by the resin member interposed between the at least one of the first and second heat dissipation members and the metal shield. This achieves effective thermal insulation for a structure where, for example, at least one of the first and second heat dissipation members needs to be in contact with the metal shield, such as a structure where the at least one of the first and second heat dissipation members is fastened to the metal shield.

The imaging device according to Variation 3 of Embodiment includes first heat dissipation member 50 and second heat dissipation members 160 that are thermally insulated from metal shield 21*a*. With this, heat transferred from board 30 to first heat dissipation member 50 or second heat dissipation members 160 is prevented from being further transferred to camera 20. This yields a highly reliable operating environment even if board 30 reaches a high temperature.

The structure having first heat dissipation member 50 and second heat dissipation members 160 thermally insulated from camera 20 as described in Variation 3 of Embodiment may be applied to imaging unit 10 according to Embodiment.

Other Embodiments

Although main board 6 is disposed inside cover member 2 according to Embodiment above, this is not intended to be limiting. More specifically, main board 6 may be disposed outside cover member 2.

Although the wiring patterns of board 30 include both first wiring pattern 31 and second wiring patterns 32 according to Embodiment above, this is not intended to be limiting. More specifically, the wiring patterns may include at least one of first wiring pattern 31 and second wiring patterns 32.

Although each of first wiring pattern 31 and second wiring patterns 32 is planar according to Embodiment above, this is not intended to be limiting. More specifically, each of first wiring pattern 31 and second wiring patterns 32 may be a commonly-used line.

Although second heat dissipation members 60 are separately disposed according to Embodiment above, this is not intended to be limiting. More specifically, second heat dissipation members 60 according to Embodiment above may be designed into one piece and disposed in a region including an area opposite to LED elements 40 via board 30.

Although heat transfer surface 60*a* of second heat dissipation member 60 is in contact with second wiring pattern 32 via heat dissipation sheet 70 according to Embodiment above, this is not intended to be limiting. More specifically, heat transfer surface 60*a* of second heat dissipation member 60 may be in contact with second wiring pattern 32 without heat dissipation sheet 70.

Although the end surface of screw fastening part 50*c*, which is on heat transfer surface 50*a* of first heat dissipation member 50, is in contact with first ground part 33 via bond part 37 made of, for example, solder according to Embodiment above, this is not intended to be limiting. More specifically, the end surface of screw fastening part 50*c* may be in contact with first ground part 33 without bond part 37. Similarly, the end surface of screw mounts 60*c* of second heat dissipation member 60 may be in contact with second ground part 34 without bond part 37.

Although each of fin openings 55 is disposed in alignment with a space between fins 54 in the horizontal direction according to Embodiment above, this is not intended to be limiting. More specifically, fin opening 55 may be disposed opposite to the upper end of fin 54. This structure also allows air A by natural convection to smoothly flow in the longitudinal direction of the surfaces of fins 54, and thus heat generated by board 30 is dissipated efficiently.

Imaging device 1 is described as monitoring the state of the passenger sitting in the seat of the vehicle according to Embodiment above. However, the use of imaging device 1 is not limited to this. Imaging device 1 is generally applicable to imaging devices having light-emitting elements.

Although imaging device 1 includes imaging unit 10 containing camera 20 according to Embodiment above, this is not intended to be limiting. More specifically, camera 20, the light-emitting elements implemented on board 30, and the heat dissipation members (first heat dissipation member 50 and second heat dissipation members 60) may be separate components. Then, these components may be combined to structure imaging device 1.

Although embodiments according to the present disclosure have been described thus far, the present disclosure is not limited the embodiments described above. Various changes and modifications can be made within the scope of the present disclosure.

While various embodiments have been described herein above, it is to be appreciated that various changes in form and detail may be made without departing from the spirit and scope of the present disclosure as presently or hereafter claimed.

Further Information about Technical Background to this Application

The disclosures of the following Japanese Patent Applications including specification, drawings and claims are incorporated herein by references on their entirety: Japanese Patent Application No. 2018-104858 filed on May 31, 2018 and Japanese Patent Application No. 2018-229112 filed on Dec. 6, 2018.

INDUSTRIAL APPLICABILITY

The present disclosure has industrial applicability as, for example, an imaging device disposed in an overhead console in a vehicle and monitoring a state of a passenger sitting in a seat of the vehicle.

What is claimed is:

1. An imaging device, comprising:
a camera;
a board having a first surface, a second surface, and a wiring pattern disposed on at least one of the first surface and the second surface;
a light-emitting element disposed on the first surface of the board to be electrically connected to the wiring pattern, and emitting illumination light in an imaging direction of the camera; and
a first heat dissipation member and a second heat dissipation member that are mounted onto opposite sides of the board and that are electrically conductive and fastened to the board to cover at least the wiring pattern, and capable of dissipating heat generated at least by the board,
wherein the first heat dissipation member is disposed opposite to the first surface, and
the second heat dissipation member is disposed opposite to the second surface in a region including an area opposite to the light-emitting element via the board.

2. The imaging device according to claim 1,
wherein the first heat dissipation member and the second heat dissipation member are thermally coupled via the board.

3. The imaging device according to claim 2,
wherein the board includes a through hole penetrating the board in a direction of thickness,
the wiring pattern includes:
a first wiring pattern disposed on the first surface; and
a second wiring pattern disposed on the second surface and electrically connected to the first wiring pattern via the through hole, and
the first wiring pattern and the second wiring pattern are thermally coupled via the through hole.

4. The imaging device according to claim 3, further comprising:
a heat dissipation sheet interposed between the second wiring pattern and the second heat dissipation member, for transferring heat generated by the board and the light-emitting element to the second heat dissipation member.

5. The imaging device according to claim 1,
wherein the first heat dissipation member includes:
a base having (i) a heat transfer surface opposite to the first surface of the board and (ii) a heat dissipation surface on a reverse side of the heat transfer surface and capable of dissipating heat transferred from the first surface to the heat transfer surface; and
a plurality of fins provided spaced from each other and integrally protruding from the heat dissipation surface, the plurality of fins being cooled by air.

6. The imaging device according to claim 5,
wherein each of the plurality of fins is a substantially square pillar and includes a chamfer at at least one of:
each corner where one of a top surface and a bottom surface of each of the plurality of fins meets an adjacent side surface of the fin; and
each corner where two adjacent side surfaces of each of the plurality of fins meet.

7. The imaging device according to claim 5,
wherein the plurality of fins extend in parallel with each other in a direction of gravity.

8. The imaging device according to claim 7,
wherein the first heat dissipation member includes a fin opening disposed in an upper region of the base in a direction of gravity and penetrating the base in a direction of thickness.

9. The imaging device according to claim 8,
wherein the fin opening is disposed opposite to upper ends of the plurality of fins in the direction of gravity.

10. The imaging device according to claim 8,
wherein the fin opening is disposed above upper ends of the plurality of fins in the direction of gravity and in alignment with a space between the plurality of fins.

11. The imaging device according to claim 10, further comprising:
a front cover disposed opposite to the heat dissipation surface of the first heat dissipation member,
wherein the front cover includes an upper opening disposed above the upper ends of the plurality of fins and in alignment with the space between the plurality of fins.

12. The imaging device according to claim 11,
wherein the front cover includes a lower opening disposed below and opposite to lower ends of the plurality of fins in the direction of gravity.

13. The imaging device according to claim 1,
wherein the board further includes a connector electrically connected to the wiring pattern and connected to an external wiring member to electrically connect the external wiring member to the wiring pattern, and
at least one of the first heat dissipation member and the second heat dissipation member includes a case to cover the connector except for a part connected to the external wiring member.

14. An imaging device, comprising:
a camera including a metal shield covering side surfaces of the camera except for a side surface that crosses an optical axis of the camera;
a board having a first surface, a second surface, and a wiring pattern disposed on at least one of the first surface and the second surface;
a light-emitting element disposed on the first surface of the board to be electrically connected to the wiring pattern, and emitting illumination light in an imaging direction of the camera; and
a first heat dissipation member and a second heat dissipation member that are thermally insulated from the metal shield and that are mounted onto opposite sides of the board, and capable of dissipating heat generated at least by the board,
wherein the first heat dissipation member is disposed opposite to the first surface, and
the second heat dissipation member is disposed opposite to the second surface in a region including an area opposite to the light-emitting element via the board.

15. The imaging device according to claim 14,
wherein the first heat dissipation member and the second heat dissipation member are thermally insulated from the metal shield by one of an air layer and a resin member that is interposed between the first and second heat dissipation members and the metal shield.

16. The imaging device according to claim 14,
wherein the resin member is disposed between, and jointly fastened by, at least one of the first heat dissipation member and the second heat dissipation member and the metal shield.

17. The imaging device according to claim 14,
wherein the first heat dissipation member and the second heat dissipation member are thermally coupled via the board.

18. The imaging device according to claim 17,
wherein the board includes a through hole penetrating the board in a direction of thickness,
the wiring pattern includes:
   a first wiring pattern disposed on the first surface; and
   a second wiring pattern disposed on the second surface and electrically connected to the first wiring pattern via the through hole, and
the first wiring pattern and the second wiring pattern are thermally coupled via the through hole.

19. The imaging device according to claim 14,
wherein the first heat dissipation member includes:
a base having (i) a heat transfer surface opposite to the first surface of the board and (ii) a heat dissipation surface on a reverse side of the heat transfer surface and capable of dissipating heat transferred from the first surface to the heat transfer surface; and
a plurality of fins provided spaced from each other and integrally protruding from the heat dissipation surface, the plurality of fins being cooled by air.

20. The imaging device according to claim 19,
wherein the plurality of fins extend in parallel with each other in a direction of gravity.

* * * * *